United States Patent [19]

Vinal

[11] Patent Number: 4,984,043
[45] Date of Patent: Jan. 8, 1991

[54] FERMI THRESHOLD FIELD EFFECT TRANSISTOR

[75] Inventor: Albert W. Vinal, Cary, N.C.

[73] Assignee: Thunderbird Technologies, Inc., Cary, N.C.

[21] Appl. No.: 370,398

[22] Filed: Jun. 22, 1989

Related U.S. Application Data

[63] Continuation-in-part of Ser. No. 318,153, Mar. 2, 1989.

[51] Int. Cl.$^5$ .................... H01L 29/78; H01L 29/86
[52] U.S. Cl. ............................ 357/23.14; 357/23.12
[58] Field of Search .................. 357/23.14, 23.12, 23.3

[56] References Cited

U.S. PATENT DOCUMENTS 3,653,978  4/1972  Robinson et al. ............ 357/23.12 X
3,789,504  2/1974  Jaddam ........................ 357/23.12 X

OTHER PUBLICATIONS

A Normally-Off Type Buried Channel MOSFET for VLSI Circuits; by K. Nishiuchi et al. (IEDM Technical Digest, 1979, pp. 26-29).

Primary Examiner—Rolf Hille
Assistant Examiner—Roy Potter
Attorney, Agent, or Firm—Bell, Seltzer, Park & Gibson

[57] ABSTRACT

A field effect transistor (FET) operates in the enhancement mode without requiring inversion by setting the device's threshold voltage to twice the Fermi potential of the semiconductor material. The FET, referred to as a Fermi Threshold FET or Fermi-FET, has a threshold voltage which is independent of oxide thickness, channel length, drain voltage and substrate doping. The vertical electric field in the channel becomes zero, thereby maximizing carrier mobility, and minimizing hot electron effects. A high speed device, substantially independent of device dimensions is thereby provided, which may be manufactured using relaxed groundrules, to provide low cost, high yield devices.

Temperature dependence of threshold voltage may also be eliminated by providing a semiconductor gate contact which neutralizes the effect of substrate contact potential. Source and drain subdiffusion regions may be provided to simultaneously maximize the punch-through and impact ionization voltages of the devices, so that short channel devices do not require scaled-down power supply voltages. Multi gate devices may be provided. An accelerator gate, adjacent the drain, may further improve performance.

The Fermi-FET criteria may be maintained, while allowing for a deep channel by providing a substrate contact for the Fermi-FET and applying a substrate bias to this contact. Substrate enhancement pocket regions adjacent the source and drain regions may be provided to produce a continuous depletion region under the source, drain and channel regions to thereby minimize punch-through effects.

24 Claims, 26 Drawing Sheets

Empty Channel Condition

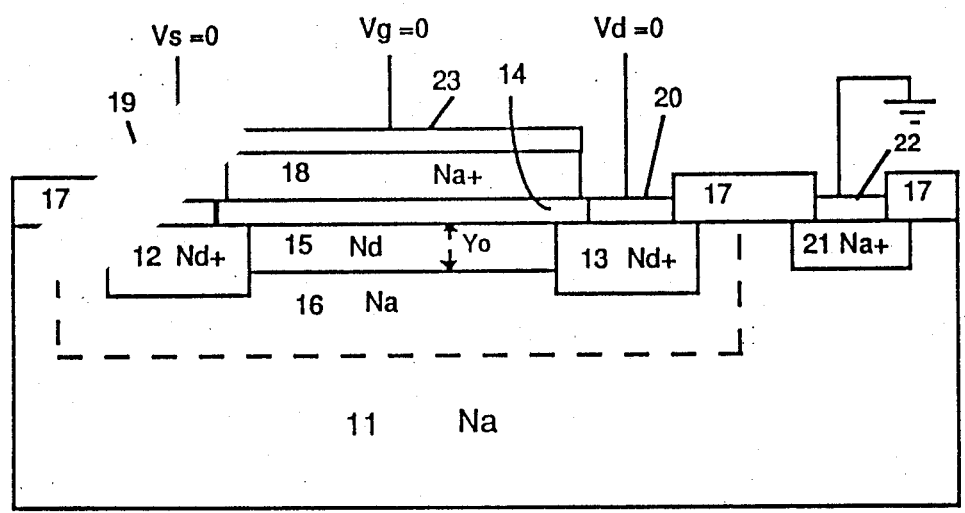
Figure 1A    Empty Channel Condition
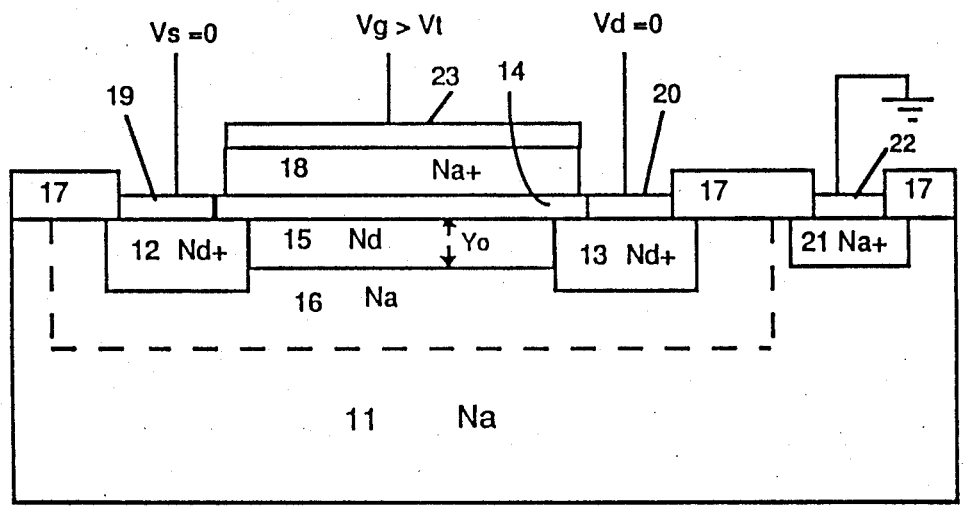
Figure 1B    Half Full Channel Condition

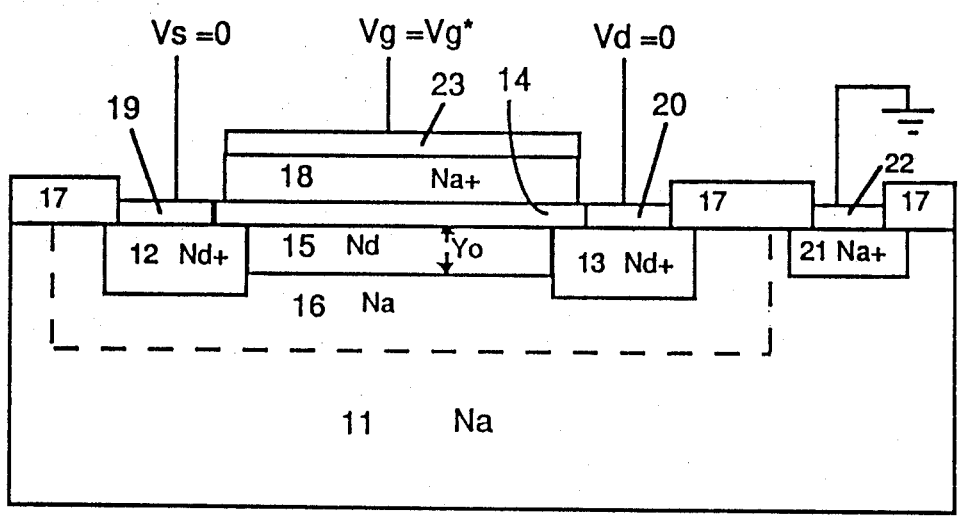
Figure 1C  Full Channel Condition
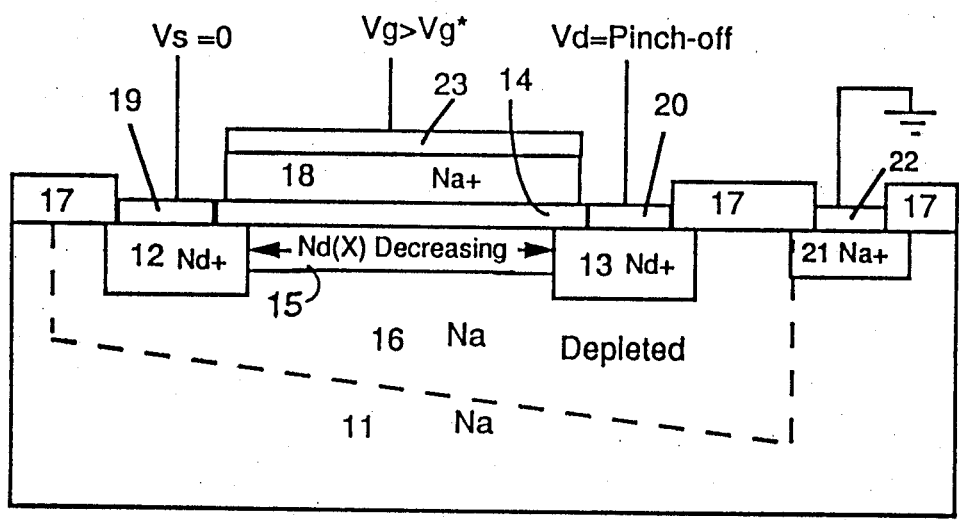
Figure 1D  Fermi-FET at Pinch-off

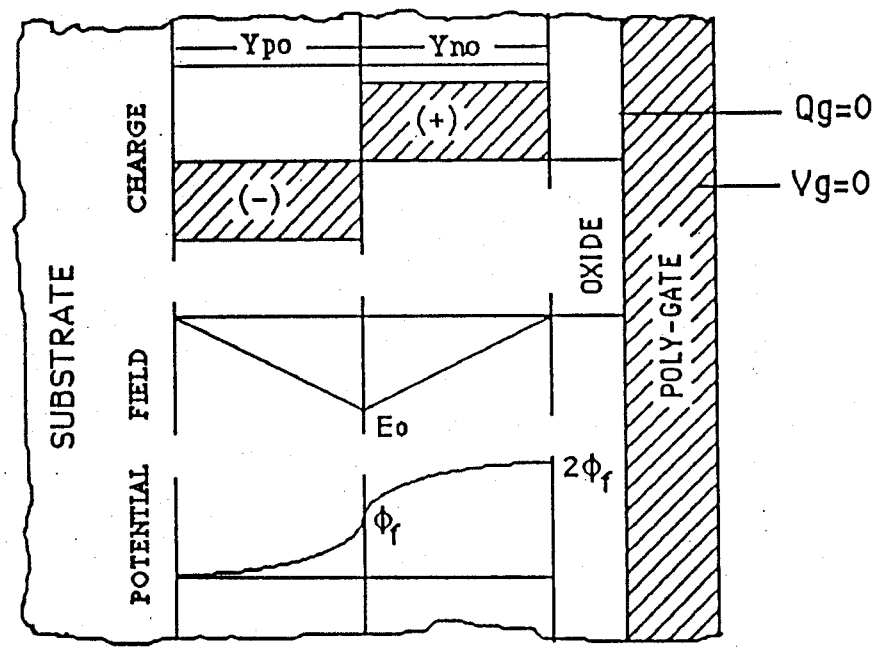
Figure 2-A
EMPTY CHANNEL
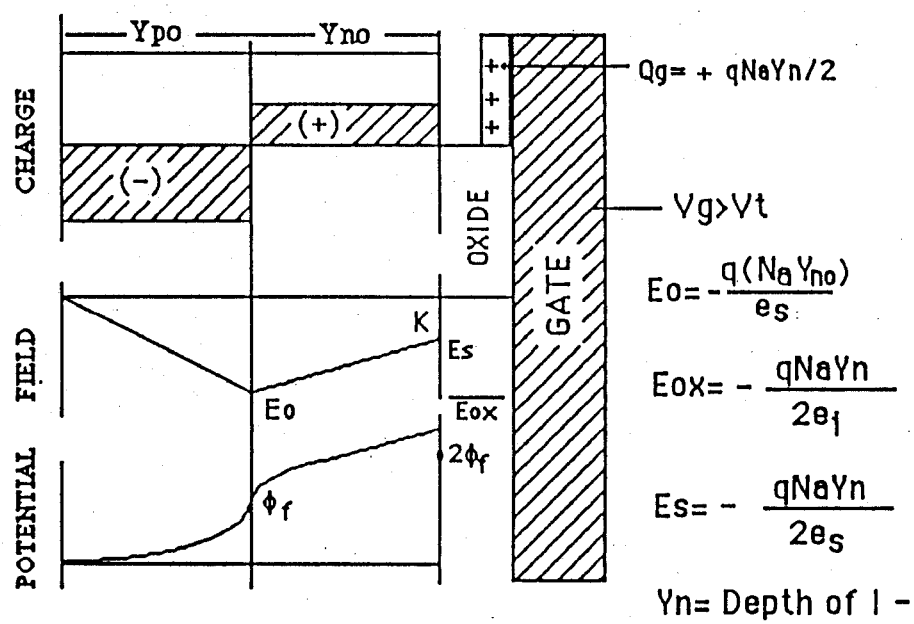
Figure 2-B
HALF FULL CHANNEL

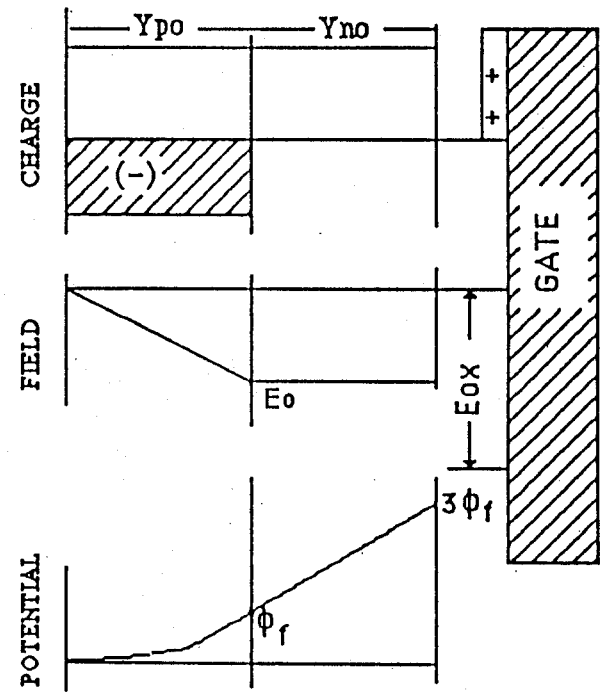
FIG.2-C Full Channel Condition
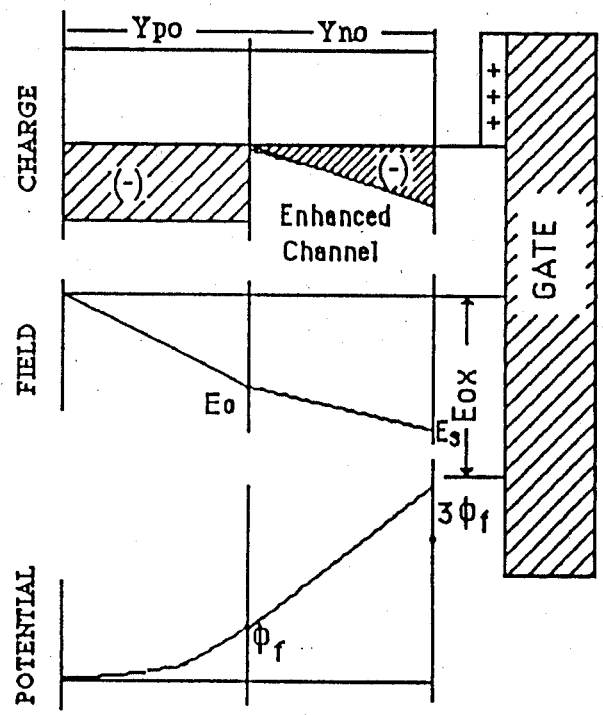
Figure 2-D Enhanced Channel

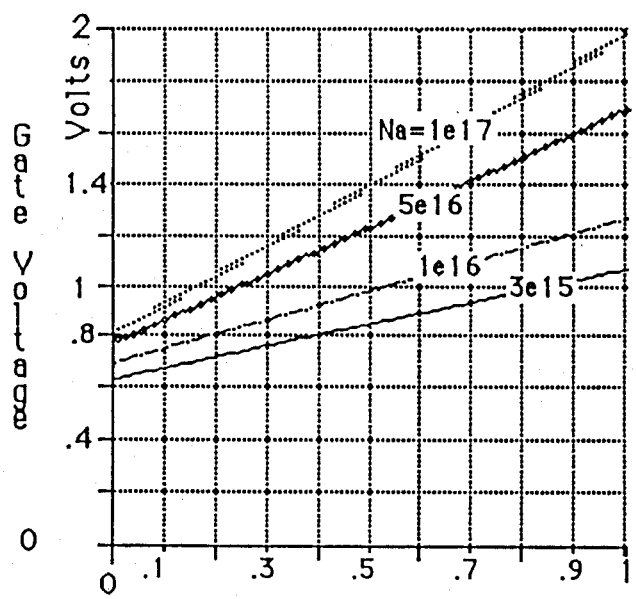
Figure 3-A
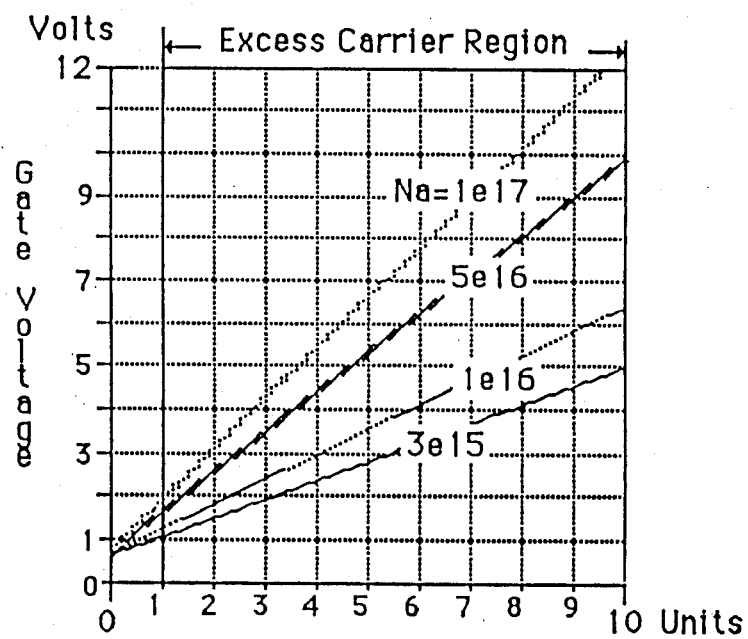
Figure 3-B

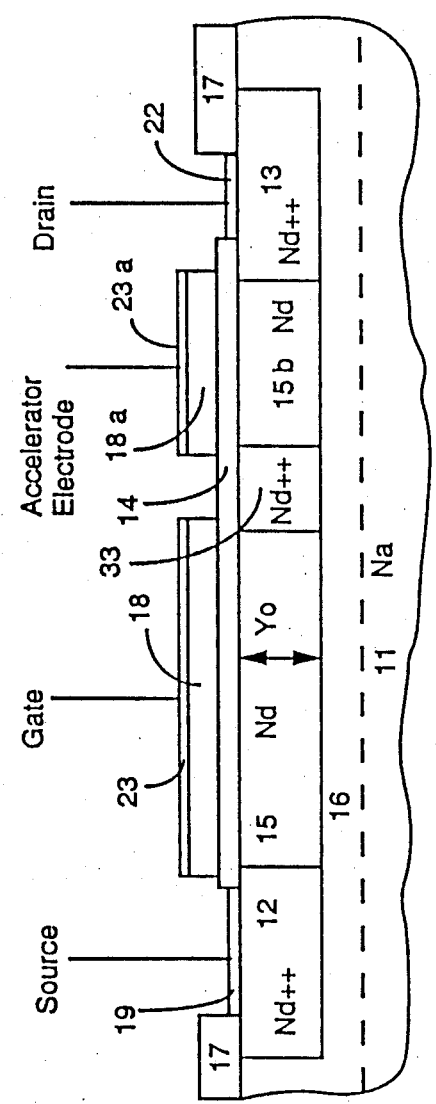
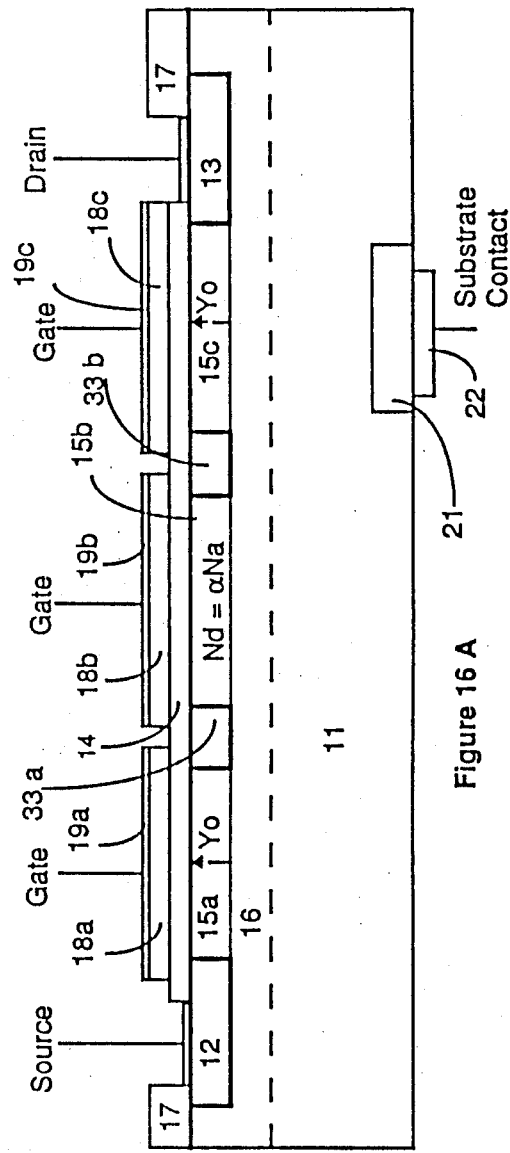

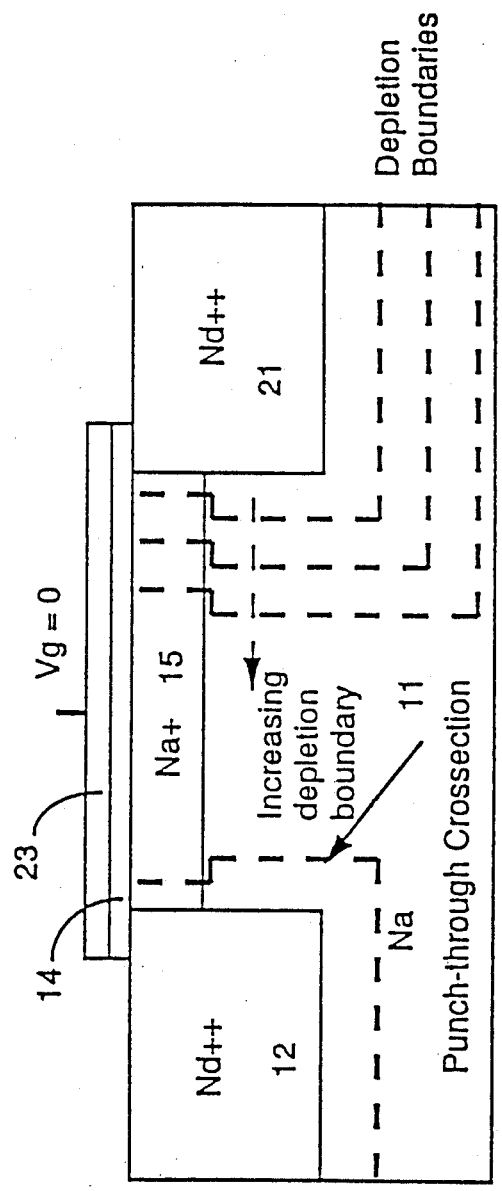

L = Z = 1.0um, Na=5e15, K=2 Vsub=0, Tox=120A Yo=1682A Fermi FET

L = Z = 0.5mm, Na=5e15, , Tox=120A Fermi FET N

L = Z = 0.5mm, Na=5e15, K=3 Tox=120A Fermi FET P

FERMI THRESHOLD FIELD EFFECT TRANSISTOR

CROSS REFERENCE TO RELATED APPLICATION

This application is a continuation-in-part of co-pending application Ser. No. 07/318,153, filed Mar. 2, 1989.

FIELD OF THE INVENTION

This invention relates to field effect transistor devices, and more particularly to high speed field effect transistors having operational characteristics which are independent of device dimensions, operating temperature and doping concentrations.

BACKGROUND OF THE INVENTION

Field Effect Transistors (FET's) have become the dominant active device for Very Large Scale Integration (VLSI) and Ultra Large Scale Integration (ULSI) applications, because the integrated circuit FET is by nature a high impedance, high density, low power device. Much research and development activity has focused on improving speed and density of FETs, and on lowering the power consumption thereof.

As is well known to those having skill in the art there are two types of FET devices: the Insulated Gate FET (IGFET) and the Junction FET (JFET). Most present day integrated circuit technology employs the IGFET because of its simplified construction for integrated circuit applications. An IGFET typically comprises source and drain regions in a semiconductor substrate at a first surface thereof, and a gate region therebetween. The gate comprises an insulator on the first substrate surface between the source and drain regions, with a gate electrode or contact on the insulator. A channel is formed in the semiconductor substrate beneath the gate electrode, and the channel current is controlled by a voltage at the gate electrode.

In the most common configuration of an IGFET, an oxide layer is grown or otherwise formed on the first semiconductor surface, between the source and drain regions, and a metal or other gate electrode is formed on the oxide layer. This structure is commonly called a Metal Oxide Semiconductor Field Effect Transistor (MOS or MOSFET). The terms MOS and MOSFET are now used interchangeably with IGFET to include devices in which the insulator is a material other than an oxide (for example a nitride), and the gate electrode is a material other than metal (for example polysilicon). These terms will be used interchangeably herein.

Two types of channels may be provided in MOS devices. The first is referred to as an "induced channel", in which gate voltage induces a field in the substrate under the gate to thereby draw electrons (for a P-type substrate) into the region beneath the gate. As a result, this region changes conductivity type (e.g. P-type to N-type), and an induced channel is formed. The induced change of semiconductor material from one conductivity type to opposite conductivity type is called "inversion". Increasing gate voltage enhances the availability of electrons in the channel, so that an induced channel MOS device is referred to as operating in an "enhancement" mode.

The second type of channel is a "diffused channel" in which a channel having conductivity opposite that of the substrate is formed beneath the gate electrode. In such a device, current flows between source and drain even in the absence of gate voltage. Decreasing gate voltage causes current to decrease as the diffused channel is depleted of carriers. Increasing gate voltage causes the gate current to increase as the diffused channel is enhanced Accordingly, a diffused channel MOS device may operate in "enhancement" or "depletion" modes.

Enhancement mode (induced channel) devices are preferred for digital integrated circuit applications because these devices are off at zero gate voltage. Both enhancement and depletion mode devices have a threshold voltage associated therewith. The threshold voltage is the value of gate voltage needed to initiate device conduction. Threshold voltage is an important MOS characteristic and must be well controlled to provide satisfactory integrated circuit devices Unfortunately, the threshold voltage of known MOS devices typically varies as a function of the oxide thickness, the length of the channel, drain voltage, and the substrate doping concentration. Since each of these parameters can vary dramatically from one integrated circuit to another, very strict manufacturing tolerances (often referred to as "groundrules") must be provided to ensure device uniformity. However, strict manufacturing ground rules lower device yields. Moreover, since device dimensions and doping levels become more difficult to control as the devices become smaller, increases in device density and operating speed are difficult to obtain.

The threshold voltage of conventional MOS devices also varies as a function of device temperature. Unfortunately, device operating temperature varies considerably from one integrated circuit to another, depending upon the application. In fact, operating temperatures vary considerably within an integrated circuit, depending upon the duty cycle of the individual devices. MOS devices must be designed to operate properly despite the variation in threshold voltage with temperature. As such, lower performance and lower speed must be specified to ensure proper operation at all operating temperatures.

Many techniques have been proposed in an attempt to control threshold voltage while maintaining acceptable process groundrules; however such techniques cannot fully overcome the inherent variability of threshold voltage in the conventional FET structure. Other attempts have been made to improve the basic structure of the FET to provide improved characteristics. For example, a publication entitled *Normally-Off Type Buried Channel MOSFET For VLSI Circuits*, by K. Nishiuchi et al. (IEDM Technical Digest, 1979, pages 26–29) discloses a buried channel, MOSFET that uses a bulk region as a conducting channel in contrast with the surface channel of a conventional device. Another publication entitled *The Junction MOS (JMOS) Transistor—A High Speed Transistor For VLSI*, by E. Sun et al. (IEDM Digest, 1980, pages 791–794) discloses a MOS device using a layered N-P P-junction structure beneath a MOS gate region.

The art has heretofore not exhaustively investigated the origin of threshold voltage in FETs and the reasons for variation of threshold voltage with device characteristics. Accordingly, the art has heretofore not provided an FET design which minimizes variations of threshold voltage by eliminating those characteristics which contribute to this variation.

Miniaturization of MOS devices for VLSI and ULSI designs has also created other problems. For example, short channel devices are increasingly prone to breakdown due to well known punch-through and impact ionization effects. In order to prevent such breakdown, short channel devices have employed scaled down input (supply) voltage, for example, 3V instead of the standard 5V supplies heretofore employed However, as is well known to those having skill in the art, decreasing supply voltage causes threshold voltage to become a greater fraction of the supply voltage, thereby reducing device speed and negating the advantage of short channel devices.

Finally, as device density further increases, it has become more difficult to provide ohmic (i.e. non-rectifying) contacts to these devices. Complex contact metallurgy schemes have been developed in an attempt to provide satisfactory, high density ohmic contacts. Complex contact metallurgy creates manufacturing problems and cannot fully compensate for poor ohmic contacts themselves.

SUMMARY OF THE INVENTION

It is therefore an object of the invention to provide improved field effect transistor devices.

It is another object of the invention to provide improved MOS devices.

It is yet another object of the invention to provide high speed MOS devices.

It is still another object of the invention to provide high speed MOS devices having a threshold voltage which is independent of insulator thickness, channel length, drain voltage, substrate doping and temperature.

It is a further object of the invention to provide high density, high speed MOS devices which may be manufactured with relaxed ground rules to thereby increase device yields.

It is yet a further object of the invention to provide high density MOS devices which operate at full supply voltage without the risk of breakdown due to punch-through or impact ionization.

It is still a further object of the invention to provide high density ohmic contacts for high density MOS devices.

These and other objects are provided by a MOS device according to the present invention, which operates in the enhancement mode without requiring inversion, by setting the device's threshold voltage to twice the Fermi potential of the semiconductor material As is well known to those having skill in the art, Fermi potential is defined as that potential for which a semiconductor material has a probability of one half of being occupied by an electron. Accordingly, the FET device according to the present invention may be referred to as a Fermi Threshold FET or Fermi-FET.

It has been found, according to the invention, that when the threshold voltage is set to twice the Fermi potential, the dependance of the threshold voltage on oxide thickness, channel length, drain voltage and substrate doping is eliminated. It has also been found, according to the invention, that when the threshold voltage is set to twice the Fermi potential, the vertical electric field at the first surface of the semiconductor substrate in the channel is minimized, and is in fact substantially zero. Carrier mobility in the channel is thereby maximized, leading to a high speed MOS device with greatly reduced hot electron effects.

Stated another way, according to the invention it has been found that dependance of threshold voltage on oxide thickness, channel length, drain voltage and doping level is a result of the voltage developed across the gate oxide layer which is necessary to establish inversion in conventional MOSFET's. According to the invention, by providing a threshold voltage equal to twice the Fermi potential, inversion is prevented, leading to a high speed device substantially independent of device dimensions.

In a preferred embodiment of the invention it has been found that the above described Fermi-FET criteria may be met by forming a contra doped channel region having a carrier concentration or dopant density $\alpha$ times the dopant density of the substrate and having a channel depth $Y_o$ which is specified as:

$$Y_o = \sqrt{\frac{2e_s\phi_s}{qN_s\alpha(\alpha + 1)}}$$

where $e_s$ is the dielectric constant of the semiconductor material (Farads/cm), q is the electric charge ($1.6 \times 10^{-19}$C), and $N_s$ is the substrate doping density.

According to another aspect of the invention it has been found that the contact potentials (referred to as a "flat-band voltages") generated by conventional FET substrate and gate contacts may adversely effect the threshold voltage of FET devices, in a manner not accounted for in previous FET designs. According to the invention, it has been found that the FET gate contact may be selected to be a semiconductor having a conductivity type and dopant density which generates a gate contact potential which is equal and opposite to that of the substrate contact potential, thereby neutralizing the effect of flat-band voltages. Dependence of threshold voltage on temperature is thereby eliminated. In order to neutralize the substrate flat-band voltage, the gate electrode is selected to be the same semiconductor as the substrate, having the same conductivity type and similar doping density as the substrate. In a preferred embodiment, when the substrate is monocrystalline silicon, the gate electrode is polysilicon.

Flat-band voltage compensation may be employed to improve the performance of conventional FET's, in order to make P- and N-channel threshold voltages symmetric and less dependent upon temperature. Moreover, since the threshold voltage of the Fermi-FET is already independent of other device parameters, the use of flat-band voltage compensation further enhances the performance thereof.

Conventional high density FET devices have shallow channels, and relatively deep diffusions which place severe constraints on means to control punch-through. According to the invention, the Fermi-FET criteria described above may be maintained, while allowing for a deep channel by providing a substrate contact for the Fermi-FET and applying a substrate bias on this contact. For N-channel Fermi-FETs a negative substrate bias is applied, while for P-channel Fermi-FETs, a positive substrate bias is applied. In the presence of a substrate voltage bias $V_{sub}$, the channel depth which satisfies the Fermi-FET criteria becomes:

$$Y_o = \sqrt{\frac{2e_s(\phi_s + |V_{sub}|)}{qN_s\alpha(\alpha + 1)}}$$

Accordingly, deep channels may be provided, with the resultant ease of manufacturability.

It has also been found that substrate bias the deep channel produces increased drain conductance at low values of drain voltage. Since the source and drain depths are also preferably increased to maintain depth equality with the channel, source and drain resistance is also decreased. Diffusion capacitance and gate capacitance also decrease and ground plane noise immunity increases. Although deep channels result in a decrease in transconductance, the toggle rate of the Fermi-FET devices with substrate bias will remain about the same as unbiased devices because of the reduced capacitive loading. In a preferred embodiment, the substrate bias is less than 2V in absolute value.

According to yet another aspect of the present invention a drain subdiffusion region may be provided in the semiconductor substrate adjacent the drain, to thereby minimize the effect of both punch-through and avalanche breakdown voltages on the device. In particular, the drain subdiffusion is of the same conductivity type as the drain and has a dopant density which is a factor times the dopant density of the substrate. The factor may be selected to simultaneously maximize punch-through breakdown and avalanche breakdown voltages between the drain and substrate. A similar source subdiffusion may also be provided. Immunity to avalanche breakdown and punch-through are thereby both maximized, so that short channel FET devices may operate with full power supply voltage; i.e. a scaled down supply voltage is not needed.

The subdiffusion regions of the present invention may be employed to improve the performance of conventional FET's, to make them more immune to avalanche and punch-through breakdown. Subdiffusion regions may also be employed to further enhance the performance of the Fermi-FET.

According to yet another aspect of the present invention, control of punch-through is further enhanced by ensuring that the depth of the depletion region in the substrate at threshold is the same under the source and drain diffusions as it is under the implemented channel, when zero voltage is applied to the source and drain diffusions. This continuity of depletion boundary at the source and of the channel eliminates punch through cross section and is accomplished by providing substrate enhancement pocket regions into which the drain and source depletion regions are implemented. The substrate pocket regions have the same conductivity type as the substrate and have a doping factor greater than the substrate. According to the invention, the doping factor is chosen to make the depth of the depletion region under the source equal to the depth of the diffusion region under the implemented channel at the threshold voltage.

The Fermi-FET of the present invention particularly lends itself to the use of multiple gate electrodes, for use in complementary MOS (CMOS) or other logic technologies which require connecting of transistors in series to achieve the desired logic function while maintaining essentially zero idle power. When multiple gate Fermi-FET devices are employed, it has been found that performance is improved when the gate immediately adjacent the drain is maintained at a full "on" value. This gate, referred to as an accelerator electrode, reduces the threshold voltage for the remaining gate or gates in the multi-gate Fermi-FET device.

BRIEF DESCRIPTION OF THE DRAWINGS

FIGS. 1A–1D illustrate cross-sectional views of the Fermi-FET device of the present invention under various operating conditions.

FIGS. 2A–2D are graphical representations of various device parameters of the present invention, for the operating conditions of FIGS. 1A–1D.

FIGS. 3A–3B graphically illustrate gate voltage as a function of carrier density factor according to the present invention.

FIG. 15 illustrates a cross-sectional view of a Fermi-FET according to the present invention, including an accelerator electrode.

FIGS. 17A–17B illustrate cross-sectional views of punch-through in conventional FETs.

DETAILED DESCRIPTION OF THE INVENTION

Figure 4A:
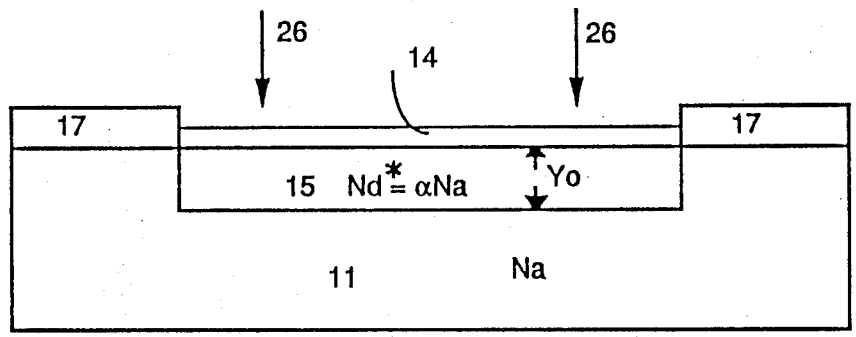
FIG. 4A–4D illustrate cross-sectional views of a process for fabricating Fermi-FET devices according to the present invention.

The present invention now will be described more fully hereinafter with reference to the accompanying drawings, in which a preferred embodiment of the invention is shown. This invention may, however, be embodied in many different forms and should not be construed as limited to the embodiment set forth herein; rather, applicant provides this embodiment so that this disclosure will be thorough and complete, and will fully convey the scope of the invention to those skilled in the art. For ease of illustration the thickness of layers has been exaggerated. Like numbers refer to like elements throughout. It will be understood by those having skill in the art that the Fermi-FET of the present invention is applicable to both P and N channel devices and to silicon, germanium and other semiconductor materials.

FET Design Analysis

Before describing the Fermi-FET of the present invention, an analysis of FET design relationships will be developed. Throughout this specification, the terms MOS, FET, MOSFET and IGFET will be employed as synonyms to describe a field effect transistor structure having an insulated gate, wherein the insulation may be, but is not necessarily, an oxide, and wherein the gate may be, but is not necessarily, metal.

An induced channel MOSFET requires a gate voltage to induce an inversion layer of minority carriers that act to conduct current between the source and drain. A gate threshold voltage condition is achieved when the surface potential $\phi_s$ of the semiconductor substrate, below the gate, is elevated sufficiently to bend the intrinsic energy band of the semiconductor material, down below the Fermi level. This rise in substrate surface potential is the result of increasing gate voltage $V_g$ to induce a depletion layer, with depth $W_{do}$, in the substrate below the gate.

Using Poisson's equation, the potential rise across the depletion layer is $\phi_s = (q/2e_s)(N_a W_{do}^2)$, where q is the electron charge in Coulombs, $e_s$ is the dielectric constant of the semiconductor material (Farads/cm), $N_a$ is the substrate acceptor concentration level, and $W_{do}$ is the depletion depth. Depletion depth $W_{do}$ is defined as $W_{do} = \sqrt{(2e_s\phi_s/(qN_a))}$. The electric field at the substrate surface is $E_s = \sqrt{(2\phi_s q N_a/e_s)}$. When the surface potential $\phi_s$ reaches twice the Fermi potential $2\phi_f$, the ionization concentration $N_p$, within a p- substrate, becomes equal to the substrate acceptor concentration $N_a$. Surface potential $\phi_s$ need only be increased slightly above threshold voltage $2\phi_f$ in order to achieve inversion.

Unfortunately, charge is accumulated on the gate as a result of creating the inversion layer. The density of this gate charge is $qN_aW_{do}$ Coulombs per cm$^2$. Gate threshold voltage $V_t$ is the sum of the voltage developed across the gate oxide layer and the rise in substrate potential $2\phi_f$. The gate oxide field is $qN_aW_{do}/e_i$, and the voltage $V_{ox}$ is $qN_aW_{do}/C_i$, where $C_i = e_i/T_{ox}$ and $T_{ox}$ is the oxide thickness. Therefore, $$V_t = \frac{L^*}{L} \frac{\sqrt{2e_s q N_a \phi_s}}{C_i} + \phi_s - V_{cs} + V_{cg} \quad (1)$$

Where;

$\phi_s = 2\phi_f$,
$L^*$ = Effective channel length, as described in detail below,
$V_{cs}$ = substrate contact potential, and
$V_{cg}$ = gate contact potential.

When voltage is applied to the drain and source regions, a potential V(X) is introduced at position X along the channel between the drain and source. This potential is described in detail below. The oxide threshold voltage term in Equation 1 increases with voltage V(X) in accordance with Equation 2:

$$V_t(X) = \frac{L^*}{L} \frac{\sqrt{2e_s q N_a \phi_s \left(1 + \frac{V(X)}{V_0}\right)}}{C_i} + \quad (2)$$

$$\phi_s \left(1 + \frac{V(X)}{V_0}\right) - V_{cs} + V_{cg}$$

Thus, the threshold voltage contribution due to gate charge Equation 2 is complex and causes difficulties in both digital and analog circuit design and device fabrication. In particular, high speed short channel C-MOS logic design is severely compromised by this threshold voltage term. Threshold voltage sensitivity to substrate surface doping also hinders corrective measures needed to eliminate drain-source punch-through in conventional short channel MOSFET devices.

The Fermi-FET Concept

According to the present invention, Fermi-FET design is achieved by a grounded source FET device devoid of the complex threshold voltage term shown in Equation 1 above. The basic N-Channel Fermi-FET is illustrated by FIG. 1A. A P-channel Fermi-FET is fabricated the same way but with opposite conductivity materials.

Referring now to FIG. 1A, a Fermi-FET 10 according to the present invention is fabricated in a semiconductor substrate having an acceptor concentration $N_a$. It will be understood by those having skill in the art that semiconductor substrate 11 may be silicon, gallium arsenide or other semiconductors, and may be an epitaxial or "tub" region formed in a semiconductor substrate. Source region 12 and drain region 13 are formed in the semiconductor substrate. Source and drain regions 12 and 13 are of opposite conductivity from substrate region 11 and have a higher donor concentration (i.e. they are doped $N_d$+). Source electrode 19 and drain electrode 20 form external contacts for these regions. A thin gate oxide layer 14 is formed on the surface of substrate 11. A gate contact is formed on the gate oxide 14. In the embodiment illustrated the gate contact comprises a polysilicon gate contact 18 and a metal gate electrode 23 for reasons described more fully below. A substrate contact region 21 is formed within the semiconductor substrate 11. Contact 21 is typically of the same conductivity as substrate 11 but more highly doped (e.g. it is doped $N_a$+). Finally, field oxide regions 17 isolate devices from one another.

According to the present invention, a channel having the same conductivity type as the source and drain regions and opposite conductivity to the substrate is formed for example by implanting through thin gate oxide layer 14. The channel has a depth, $Y_o$ and a donor doping level $N_d$. The depth, doping and channel are critical for forming the Fermi-FET device of the present invention. In one embodiment, the substrate is a P-type substrate while source drain and channel regions are N-type.

It will be shown according to the present invention that when channel 15 has the proper doping level and depth, a depletion region 16 is formed in substrate 11 and the channel 15 is completely self-depleted, as shown in FIG. 1A.

Still referring to FIG. 1A, the basic criteria for an N-channel Fermi-FET will now be described. The criteria for P-channel devices are the same except donor and acceptor ion types are interchanged. The nominal implant depth $Y_o$ of the channel is governed by Equation 3A and the effective donor concentration $N_d^*$ is defined by Equation 3C.

$$Y_0 = \sqrt{\frac{2e_s V_0}{qN_d^*}\left(\frac{N_a}{N_a + N_d^*}\right)} = \sqrt{\frac{2e_s \phi_s}{qN_s \alpha(\alpha + 1)}} \quad (3A)$$

$$V_0 = \phi_s = 2\phi_f + \frac{KT}{q}\ln\left(\frac{N_d^*}{N_a}\right) \quad (3B)$$

$$N_d^* = \frac{1}{d}\int_0^d N_d(y)dy = \alpha N_s \quad (3C)$$

Given proper dose and depth, the implanted channel 15 is completely self-depleted as shown in FIG. 1A. Complete channel self-depletion is the result of electron and hole diffusion across the junction between the channel 315 and the substrate 11. This carrier diffusion process is required to establish a constant Fermi potential across that P-N junction region. There are critical conditions for the implant depth and dose. The entire implanted channel with depth $Y_o$, (Equation 3A), must be depleted of mobile electrons when the electric field $E_o$ at the channel-substrate junction reaches the value needed to terminate carrier diffusion across that junction. The total voltage $V_o$ developed across the depleted substrate 16 and channel region 15 (Equation 3B) raises the substrate surface potential $\phi_s$ to twice the Fermi potential $2\phi_f$ if and only if $N_a^* = N_a$. In general, $N_s$ defines the substrate doping density and $N_c$, the channel doping density. This threshold voltage condition $2\phi_f$ is achieved without introducing charge on the gate. This condition is true since the normal component of electric field, due to depletion effects, is zero at the surface of the semiconductor below the gate. The total threshold voltage expression for the Fermi-FET is therefore;

$$V_t = \phi_s\left\{\frac{\alpha}{\alpha + 1}\left(1 + \frac{V_s}{\phi_s}\right) + \frac{2}{\alpha + 1}\sqrt{1 + \frac{V_s}{\phi_s}} - \frac{1}{\alpha + 1}\right\} + \frac{1}{C_i}\sqrt{2qN_a e_s\left(\frac{\alpha}{\alpha + 1}\right)\phi_s}\left[\sqrt{1 + \frac{V_s}{\phi_s}} - 1\right] \quad (4)$$

Where

-continued $V_s$ = Source voltage, $$\phi_s = 2\phi_f + \frac{KT}{q}\ln(\alpha), \text{ and}$$

$$\alpha = N_a^*/N_a$$

Given the special condition $N_a^* = N_a$, i.e. $\alpha = 1$, the correct implant depth (Equation 3A) becomes $$Y_o = \sqrt{\frac{2\phi_f e_s}{qN_a}} \quad (5)$$

Where:

$$\phi_f = \frac{KT}{q}\ln\left(\frac{N_a}{N_i}\right),$$

$e_s$ = dielectric constant of silicon,
$N_s$ = Acceptor concentration of substrate (N-channel), and
$N_i$ = Intrinsic carrier concentration.

Table 1 lists nominal values for implant depth $Y_o$ in silicon as a function of substrate doping for $\alpha = 1$. The correct implant depth is subject to the condition $N_d^* = N_{as}$ for an N-channel device or $N_a^* = N_{ds}$ for a P-channel device. Subscript s denotes the substrate.

TABLE 1

| $N_{as}$ or $N_{ds}$ (cm$^{-3}$) | Critical Implant Depth, $Y_0$ (Angstroms) |
|---|---|
| $1 \times 10^{17}$ | 714 |
| $5 \times 10^{16}$ | 988 |
| $2 \times 10^{16}$ | 1523 |
| $1 \times 10^{16}$ | 2087 |
| $8 \times 10^{15}$ | 2314 |
| $5 \times 10^{15}$ | 2875 |
| $1 \times 10^{15}$ | 6008 |

The Fermi-FET design of the present invention achieves the objective of eliminating the complex oxide threshold voltage first term (Equation 1) typical of conventional enhancement MOSFET's. It will be shown subsequently that fabrication of the Fermi-FET is relatively simple and is applicable to long, medium, and short P- and N-channel devices. The benefits of the Fermi-FET are: high manufacturing yield, high speed circuit capabilities (low giga-hertz range), control of punch-through and avalanche breakdown, minimization of hot electron effects, and greatly simplified user design groundrules for both analog and digital circuits.

Fermi - FET Operation

Referring again to FIGS. 1A through FIG. 1C, as gate voltage $V_g$ is increased above threshold voltage $V_t$, electric field and potential increase at the substrate surface directly below the gate. This rise in surface electric field and potential occurs as mobile electrons fill the holes in the depleted implant channel region 15. The holes in the depleted channel 15 are uniformly filled as gate voltage is increased above threshold. The half full and full channel conditions are illustrated by FIGS. 1B and FIG. 1C respectively. For each hole filled in the depleted channel 15, a unit of positive charge $(1.6 \times 10^{-19}$ Coulombs) appears on the gate electrode in order to conserve charge. Filling the empty donor sites of the implanted channel with electrons allows conduction current to flow between the source and drain. The channel is totally charge neutral when all of the empty holes are filled with electrons. When charge neutrality occurs, the volume density of conduction carriers corresponds to the donor concentration $N_d$. Increasing gate voltage to induce the full channel value, $V_g^*$, fills the entire depleted channel region with electrons.

The full channel condition is illustrated by FIG. 1C. When "full" channel conditions are achieved, positive charge density on the gate electrode is uniform and has the value $qN_aY_o$ Coulombs/cm² for $\alpha=1$. The electric field developed across the oxide layer is $E_{ox}=(qN_aY_o)/e_i$, and the electric field at the surface of the semiconductor and across the "full" implanted region is $(qN_aY_o)/e_s$ since $\nabla \cdot D = 0$ there and in the oxide layer. The oxide potential is $V_{ox}=(qN_aY_oT_{ox})/e_i$. Gate voltage $V_g^*$ at the "full" channel condition, is the sum of the oxide potential $V_{ox}$ and potential $\phi_s$ developed across the channel 15 and the ionized region of the substrate below the channel.

Referring now to FIG. 1D, when gate voltage $V_g$ exceeds the "full" channel value $V_g^*$, excess charge (mobile carriers) becomes available in the implanted channel region 15. These excess carriers account for the increase in channel current in proportion to gate overdrive voltage, $V_g > V_g^*$. A unit of positive charge also appears on the gate electrode for each excess electron created in the channel.

FIGS. 2A-2D illustrate the charge distribution, electric field, and potential for the "empty", "half-full", "full", and "enhanced" channel conditions illustrated in FIGS. 1A-1D respectively, for the case $N_d^*=N_a$. These conditions depend on gate voltage $V_g$.

Referring to the "full" channel condition (FIG. 2C), gate to substrate voltage $V_g^*$ is given by:

$$V_g^* = V_{ox} + V_{ch} + V_j \quad (6)$$

Where in general:

$$Y_{ox} = \frac{qN_d^*Y_o}{C_i} \quad \text{Voltage Across Oxide Layer} \quad (7A)$$

$$E_i = \frac{qN_d^*Y_o}{\epsilon_i} \quad \text{Electric Field Across Gate Insulator} \quad (7B)$$

$$Y_{ch} = E_{yo}Y_o = \frac{qN_d^*Y_o^2}{e_s} \quad \text{Voltage Across Channel} \quad (7C)$$

$$E_{yo} = \frac{qN_d^*Y_o}{e_s} \quad \text{Field Across Channel} \quad (7D)$$

$$V_j = \phi_s \frac{N_d^*}{N_d^* + N_a} \quad \text{Voltage At Substrate-Channel Junction} \quad (7E)$$

$$\phi_s = \frac{KT}{q} \ln\left(\frac{N_a N_d^*}{N_i^2}\right) \quad (7F)$$

$$Y_{no} = \sqrt{\frac{2e_s\phi_s}{qN_d^*}\left(\frac{N_a}{N_a + N_d^*}\right)} = \sqrt{\frac{2e_s\phi_s}{qN_a\alpha(\alpha+1)}} \quad (7G)$$

$$Y_{po} = \sqrt{\frac{2e_s\phi_s}{qN_a}\left(\frac{N_d^*}{N_a + N_d^*}\right)} \quad (7H)$$

$$N_d^* = \frac{1}{d}\int_0^d N_d(Y)dY = \alpha N_a \quad (7I)$$

For the special case, $N_d^*=N_a$, the following relations apply:

$$V_{ox} = \frac{qN_aY_o}{C_i} \quad (8A)$$

$$V_{ch} = EY_o = 2\phi_f \quad (8B)$$

$$E_{yo} = \frac{qN_aY_o}{e_s} \quad (8C)$$

$$V_j = \phi_f \quad (8D)$$
$$\phi_s = 2\phi_f \quad (8E)$$
$$Y_{no} = Y_o \quad (8F)$$
$$Y_{po} = Y_o \quad (8G)$$

$$Y_o = \sqrt{\frac{2\phi_f e_s}{qN_a}} \quad (8H)$$

Substituting the appropriate Equation 8A-8H into Equation 6, the following relationship is obtained:

$$V_g^* = \frac{1}{C_i}\sqrt{2\phi_f e_s qN_a} + 2\phi_f + \phi_f \quad (9)$$

Accordingly, for the depleted (empty) channel condition, (FIG. 2A), the potential rise $\phi_s$ at the first semiconductor surface, under the gate, is $\phi_s=2\phi_f$ volts given $N_d^*=N_a$ and no source voltage. Therefore, the potential applied to the gate electrode must exceed the surface potential ($\phi_s=2\phi_f$) in order to start filling the depleted channel with conduction electrons. The gate threshold voltage is $\phi_s$ in general (Equation 7F), and $2\phi_f$ in particular when $N_d^*=N_a$. This is a very simple criterion for threshold voltage when compared to the threshold criteria for a conventional MOSFET. The nominal grounded source Fermi-FET configuration completely eliminates the oxide voltage term (Equation 10) characteristic of conventional MOS device threshold voltage. (Note that the origin of $L^*$ will be described in detail below):

$$V_t = \frac{L^*}{L}\frac{\sqrt{2e_s qN_a\phi_s}}{C_i} \quad (10)$$

The nominal Fermi-FET has a threshold voltage expression given by Equation 4, which includes effects of source voltage $V_s$. Elimination of the conventional MOSFET oxide threshold voltage component significantly enhances Fermi-FET performance. This is a result of eliminating threshold voltage dependance on channel length, oxide thickness, drain voltage, and the doping level of the semiconductor surface.

One method of preventing punch-through in short channel devices is to simply increase substrate doping. Threshold voltage for the Fermi-FET does not include the the complex term (Equation 10), and therefore low threshold voltage can be maintained virtually independent of substrate doping. Substrate doping affects threshold voltage in the Fermi-FET only slightly due to the logarithmic dependence of the Fermi potential term $\phi_f$. A method for further enhancing the resistance to punch-through will be described below.

Referring to Equation 9, the net gate voltage $V_q^* - V_t$ required to fill the I-channel with conduction electrons may be obtained. Since threshold voltage is $2\phi_f$, it follows that:

$$V_g^* - V_t = \frac{\sqrt{2e_sqN_a\phi_f}}{C_i} + \phi_f \tag{11}$$

When drain voltage $V_d$ is increased, (source at ground potential), a critical drain ("pinch-off") saturation condition is attained (described in detail below) for a given gate voltage $V_g$. Carrier concentration within the conduction channel diminishes to a minimum value at the drain. When "pinch-off" is achieved, drain current saturates. The saturation condition is illustrated by FIG. 1D.

The effects in the channel when gate voltage $V_g$ exceeds the "full" channel value $V_g^*$ will now be described. This analysis assumes an N-channel Fermi-FET device with source and substrate voltage at ground potential. When gate voltage $V_g > V_g^*$, channel conduction capability is enhanced by increasing the volume density of conduction electrons $N_p^*$ in the channel 15 above the donor value $N_d^* = N_a$. See FIG. 2D. Gate oxide potential $V_{ox}$ is proportional to the total channel charge $qN_p^*Y_o$, where $N_p^*$ is the total volume concentration of conduction carriers in the enhanced channel. Since the implanted channel is N-type, the Fermi level is already close to the conduction band. The conduction energy band need not be bent down very far to increase the number of conduction carriers in the implanted channel region. The increase in surface potential $\phi_s$, needed to realize a carrier concentration $N_p^*$ greater than $N_a$, is $\Delta\phi_s = KT/q \ln(N_p^*/N_a)$. An increase in surface potential of 18 mv is required for the case where $N_p^* = 2N_a$.

In view of the Fermi-FET structure, it follows that most of the enhanced carrier concentration $(N_p^* - N_a)$ will be confined to a maximum depth prescribed by depth $Y_o$ of the implanted channel, because the ionized P-substrate region 16, located below the channel implant region 15, has a maximum potential $\phi_f$ at the junction between the implanted channel and the substrate when $N^* = N_a$. The remote location of the ionized substrate region from the surface and the junction potential $\phi_f$ results in a carrier concentration near the intrinsic value $N_1 = 1.5 \times 10^{10}$ cm$^{-3}$ for silicon. Thus a majority of the gate enhanced excess carrier concentration $(N_p^* - N_a)$ is located below the surface of the substrate and resides within the critical implant depth $Y_o$. If gate voltage $V_g$ is less than $V_g^*$, the implanted channel is only partially filled, a factor $F \leq 1$ applies. For enhanced channel conditions, $F > 1$. For the general condition $0 < F$:

$$V_g = \frac{F\sqrt{2e_sqN_a\phi_f}}{C_1} + \phi_f(2 + F) \tag{12}$$

where $$F = N_p^*/N_a,$$

$$V_{ox} = \frac{1}{C_1}\sqrt{2\phi_fe_sqFN_a},$$

$$V_{ch} = \phi_f(1 + F),$$

and $$V_j = \phi_f.$$

From Equation 12 it may be seen that $V_g = V_t = 2\phi_f$ when the channel filling factor $F = N_p^*/N_a = 0$. Evaluating Equation 12 for the full channel condition ($F = 1$) under the following conditions, $N_a = 5 \times 10^{16}$ cm$^{-3}$
$\phi_f = 0.39$ volts
$e_s = 1 \times 10^{-12}$ Farads/cm
$q = 1.6 \times 10^{-19}$ Coulombs
$C_i = 1.5 \times 10^{-7}$ Farads/cm$^2$
$Y_o = 9.87 \times 10^{-6}$ cm
$F = 1.0$ the following results are obtained:

$V_g^* = 1.69$ Volts $= 4.34\phi_f$
$V_g^* - V_t = 0.916$ Volts $= 2.43\phi_f$
$V_t = 2\phi_f 0.78$ Volts FIG. 3A is a plot of Equation 12 as a function $0 \leq F \leq 1$ for different values for acceptor concentration $N_a$. FIG. 3B is a plot of gate voltage $V_g$ as a function of F in the range $0 \leq F \leq 10$ and different substrate acceptor concentration $N_a$. When $F > 1$, excess carriers exist in the implanted channel and account for increased channel current. The linear behavior of $V_g$ with $F > 1$ should be noted. This linear relationship is a distinct and useful advantage of the Fermi-FET.

Equations 13A-13D present a comparison of threshold voltage for a conventional MOSFET with the ideal Fermi-FET and the deep and shallow versions resulting from errors introduced during channel implant.

$$V_{t-} = 2\phi_f + \frac{\sqrt{2}}{C_1}\sqrt{2e_sqN_a\phi_f} \quad \text{Standard MOSFET} \tag{13A}$$

$$V_t = 2\phi_f \quad \text{Nominal Fermi-FET} \tag{13B}$$

$$V_t = 2\phi_f + \frac{F\sqrt{2}}{C_1}\sqrt{2e_sqN_a\phi_f} \quad \begin{array}{l}\text{Shallow Fermi-FET}\\ Y = Y_o(1 - F)\end{array} \tag{13C}$$

$$V_{t+} = 2\phi_f - \left(\frac{F}{C_1}\sqrt{2e_sqN_a\phi_f} + \phi_fF^2\right) \begin{array}{l}\text{Deep Fermi-FET}\\ Y = Y_o(1 + F)\end{array} \tag{13D}$$

Method of Fabricating the Fermi-FET

Referring now to FIG. 4, a method of fabricating a Fermi-FET according to the present invention will now be described. In the method illustrated herein, a P-type polysilicon gate is provided for an N-channel Fermi-FET. Conversely, an N-type polysilicon gate is provided for a P-channel Fermi-FET. As described in detail below, metal-semiconductor contact potentials may significantly influence threshold voltage of any FET including the Fermi-FET. To avoid this extraneous variation in threshold voltage, a polysilicon gate is provided.

Referring now to FIG. 4A, a portion of p-substrate region 11 having acceptor concentration $N_a$ is illustrated. This substrate region may be formed by implanting and driving a dopant in an unmasked area of an intrinsic 4µ silicon epitaxial layer grown on a silicon, sapphire or other substrate. Thick and thin oxide layers, 17 and 14 respectively, are also shown. All P-channel devices are covered with photo-resist material (not shown) while low energy N-type ions (phosphorous or arsenic for example) are implanted in the direction shown by arrows 26 through the thin oxide layer 14, into the surface of the P-doped substrate. This implant provides an N-type channel region 15 with proper depth $Y_o$. The implant dose must also be controlled such that the average doping value achieves the condition $N_d^* = \alpha N_a$, where $N_d^*$ is defined by Equation 3C. P-channel implant follows similar procedures except opposite ions are implanted. This implant step is critical for both the P- and N-channel devices. Care must be exercised to achieve the proper implant energy and dose.

Figure 4B:
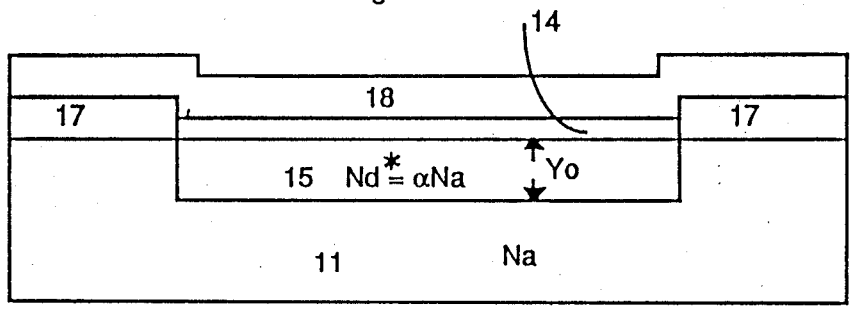

Referring to FIG. 4B, after appropriate masking and implanting both P- and N-channels 15 through the thin oxide region 14, all photoresist material is removed and intrinsic polysilicon 18 is deposited over the entire surface of the wafer.

It will be understood that the wafer may contain both P- and N-channel areas. While these figures show only N-channel areas, the P-channel areas may be formed as follows: Regions of the wafer containing intended P-channel devices, for example, may be masked with photoresist material leaving exposed polysilicon that overlays the N-channel devices. P-type ions (e.g. Boron) may then be implanted into the exposed polysilicon layer, thereby converting the intrinsic polysilicon to P++ type. Then, the photoresist masking material, covering the P-channel devices, may be removed and a new masking layer of photoresist material may be deposited over all N-channel devices. N-type ions are then implanted into the exposed polysilicon overlaying the P-channel devices, thereby converting those polysilicon regions to N++ type. The energy of both doping implants must be low enough, for the given thickness of the polysilicon layer, not to penetrate the full depth of that layer. The next step in the process is to remove the photoresist material. This step is then followed by covering the entire exposed polysilicon surface with photoresist material. The depth must be thick enough to block subsequent implantation from penetrating non-etched regions of this barrier layer.

Figure 4C:
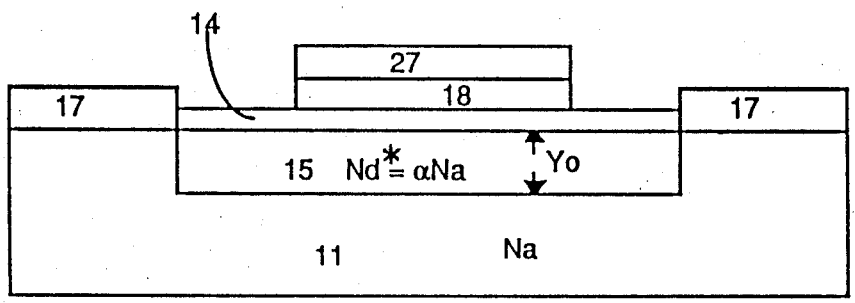

Referring now to FIG. 4C, a self-aligned poly gate mask 27 is applied next. This gate mask is aligned to the center region of the implanted P- and N-channel devices, and provides the definition for the polysilicon gate. Next, all of the exposed barrier and polysilicon layers are etched away leaving the appropriately doped polysilicon gate region with an overlaying photoresist layer as shown in FIG. 4C.

Figure 4D:
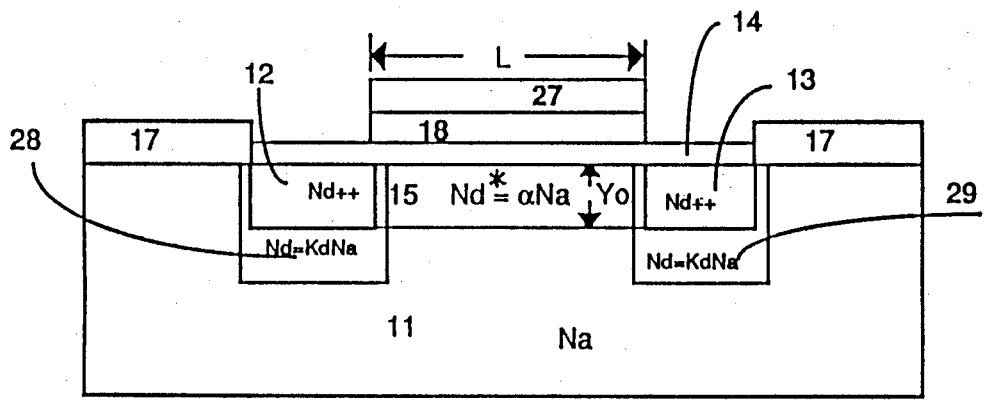

Referring now to FIG. 4D, photoresist material is then applied to mask the P-channel devices, while drain and source contact regions 12 and 13 respectively, and optional field reducing regions 28 and 29, are implanted in the N-channel devices. The functions of field reducing regions 28 and 29 will be described below. Then, this photoresist material is removed from the P-channel devices and new material is applied over the N-channel devices. The P-type source and drain regions of the P-channel devices are then implanted. The photoresist used to mask the N-channel devices is then removed, and the source and drain regions of the P-channel devices are formed. An oxidation step may then form oxide on the side-walls of the polysilicon gates previously defined, and may also anneal the implants. This oxidation also thickens the oxide layer over the source and drain regions. The remaining steps in the process need not be described here since they comprise well known and conventional steps for fabricating FET devices. These process steps include removal of oxide over the source, drain, gate, and substrate contact regions, and the application of surface passivation and contact metal to these exposed regions.

An alternative method of fabricating Fermi-FETs according to the invention, using in-situ poly-gate doping will now be decribed. According to this method, after appropriate masking and implanting both P- and N-channels through the thin oxide region, all photoresist material is removed, and an in-situ P+ doped polysilicon layer is deposited over the entire surface of the wafer as shown in FIG. 4B. The dopant density of the P+ polysilicon should be high enough to permit Ohmic-metal contact to its surface. P-channel areas may also be simultaneously formed during this process as follows: Regions of the wafer containing intended N-channel devices are masked with photo-resist material, leaving "exposed" polysilicon that overlays the P-channel devices. N-type ions such as phosphorous or arsenic are then implanted into the exposed polysilicon layer, thereby converting the in-situ doped P+ poly-silicon to N+ type. The dopant density of the N-polysilicon should be high enough to permit Ohmic-metal contact to its surface.

Then, the photo-resist masking material, covering the N-channel devices, is removed. The energy of the doping implant must be low enough for the given thickness of the polysilicon layer, so that it does not penetrate the full depth of that layer. A subsequent anneal activates and homogenizes this implant concentration. The next step in the process is to remove the photo-resist material. This step is followed by covering the entire exposed polysilicon surface with photoresist material. The depth of this photoresist barrier must be thick enough to block subsequent implantation from penetrating non-etched regions. The self-aligning poly gate mask is applied next. The remaining steps are the same as previously described.

Fermi-FET Channel Doping Considerations

The effects of channel implant concentration $N_c = \alpha N_s$, has a significant effect on drain current properties of the Fermi-FET device. Pinch-off voltage has already been described for the special case where $\alpha = 1$. This restricted the implant concentration (Equation 3C) to equal the substrate concentration with a critical depth characteristic of that condition. Below, the general expression for pinch-off Voltage $V_p$, for $\alpha$ in the range $1 > \alpha > 4$ is provided (FIG. 6). Computer plots of n-channel devices are also presented for $N_a = 1e^{17}$ and $\alpha = 0.2$, 1.0, and 5.0 (FIG. 5). Referring to these figures, it will be seen that Fermi-FET devices with low pinch-off voltage are attained when $\alpha > 1$. A preferred value is $\alpha = 2$. This value for $\alpha$ leads to high transconductance and low saturation drain conductance for sub-micron channel length devices.

The general expression for pinch-off voltage is as follows:

$$V_p = \frac{V_g - V_t}{\eta}\left(1 - \frac{1}{M^{\frac{1}{2}}}\right) + \frac{2K_1}{\eta}\left(1 + \frac{K_1}{\eta \phi_s}\right) - \quad (14)$$

-continued $$\frac{2K_1}{\eta^2 \phi_s} \sqrt{\eta \phi_s (V_g - V_t)\left(1 - \frac{1}{M^{\frac{1}{2}}}\right) + (K_1 + \eta \phi_s)^2}$$

where $$\eta = \frac{\alpha}{\alpha + 1}$$

$$\phi_s = 2\phi_f + \frac{KT}{q} \ln\alpha$$

$$A = A_1 = \frac{1}{C_i} \sqrt{2qN_s\phi_s\left(\frac{\alpha}{\alpha + 1}\right)e_s}$$

$$K_1 = \frac{A}{2} + \frac{\phi_s}{\alpha + 1}$$

$$M = \left(\frac{\mu_0 E_i}{V_{sat}}\right)^{3/2}$$

$$V_t = \phi_s$$

Figure 5A:
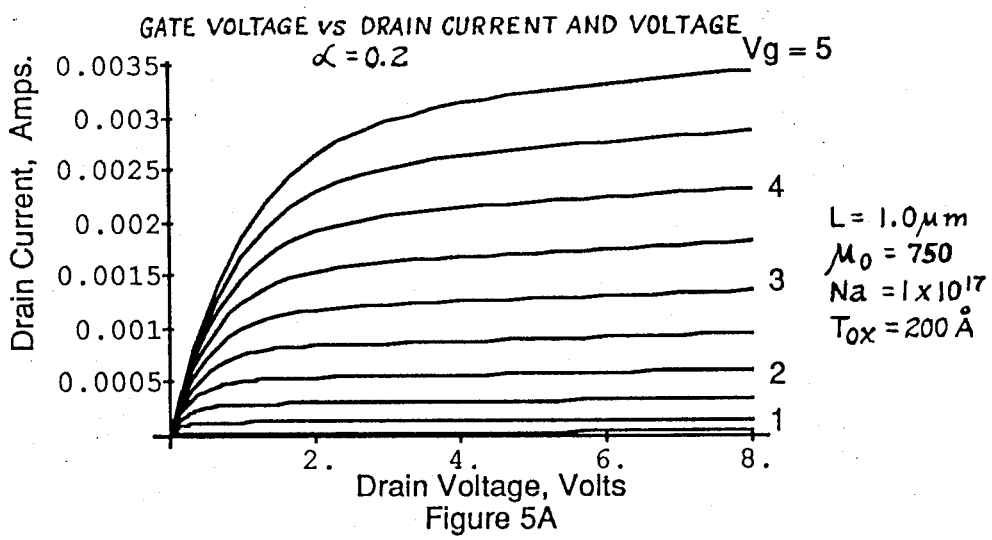
FIGS. 5A–5C graphically illustrate drain current versus drain voltage for various values of gate voltage according to the present invention.
Figure 5B:
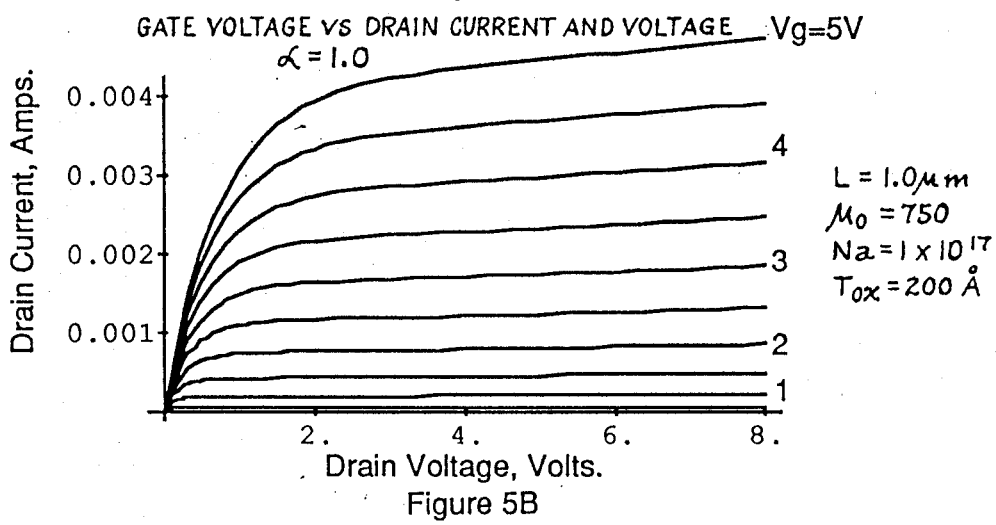
Figure 5C:
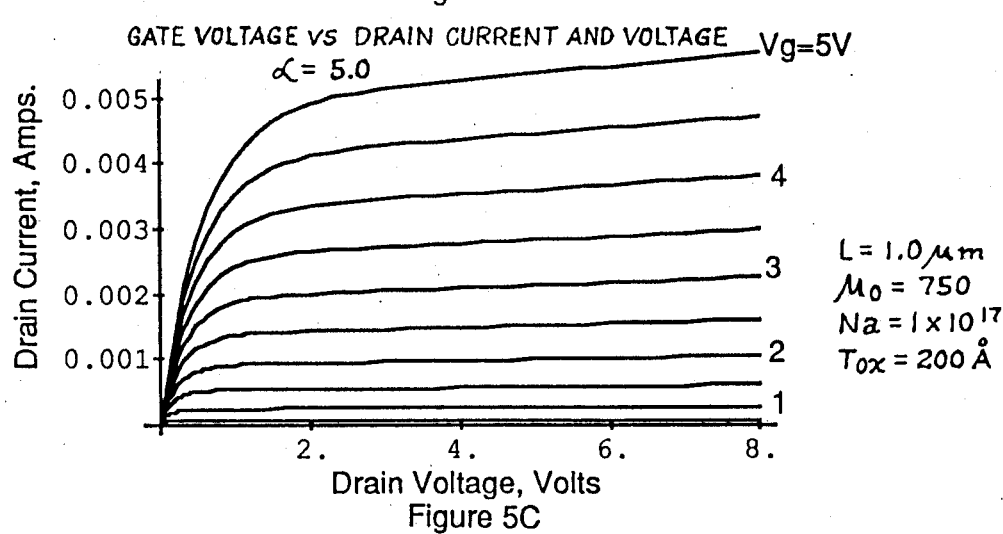

Referring now to FIG. 5A, a plot of gate voltage as a function of drain current and drain voltage for channel length of 1μm, $\mu_o$=750, $N_a$=1×10$^{17}$, $T_{ox}$=200 Å, and $\alpha$=0.2 is provided. Gate voltage is shown in steps of 0.5V, starting at 0V. FIG. 5B presents the same series of plots under the same conditions except that $\alpha$=1.0. FIG. 5C presents the same series of plots for $\alpha$=5.0.

Figure 6A:
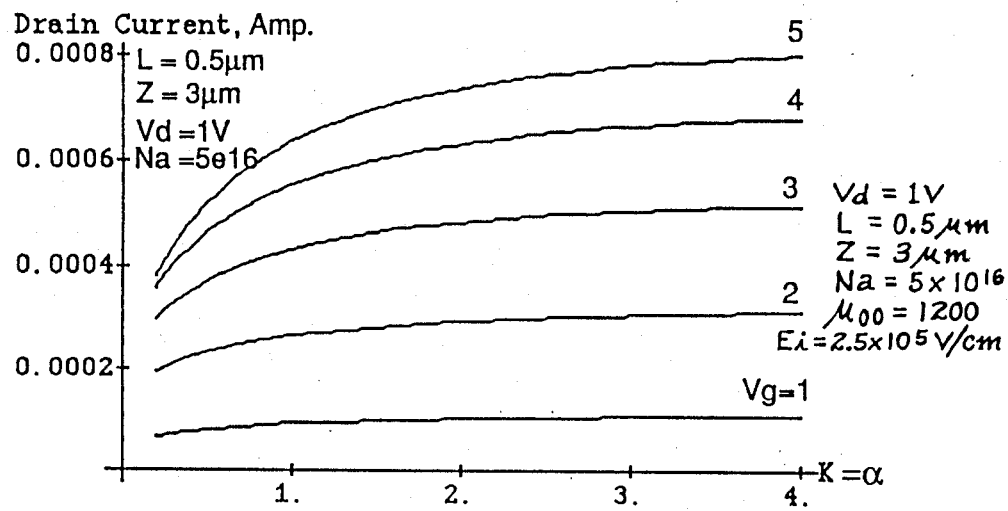
FIGS. 6A–6B graphically illustrate drain current as a function of the channel implant factor for various values of gate voltage according to the present invention.
Figure 6B:
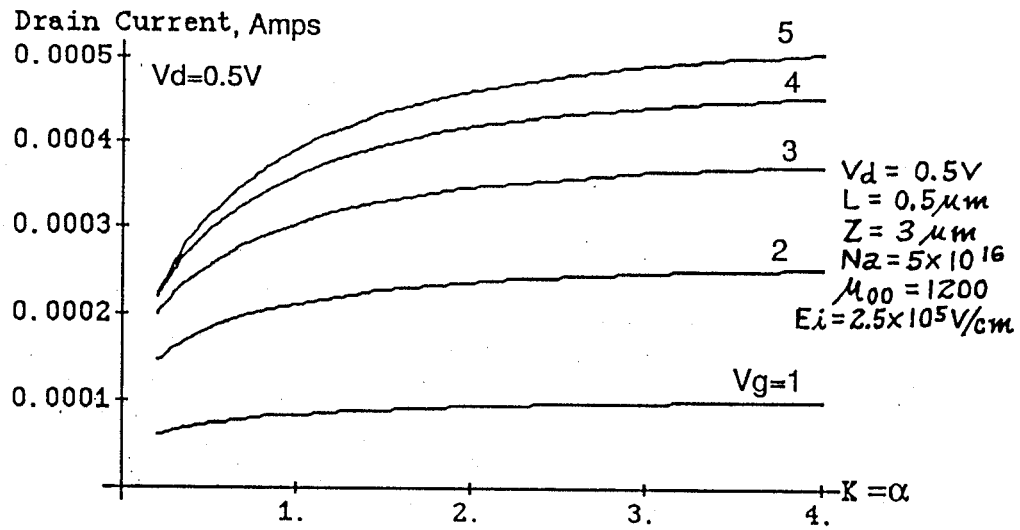

The computer generated plots of FIG. 6 illustrate the influence of channel implant factor $\alpha$ on the rising current (low drain voltage) property of the Fermi-FET device. FIG. 6A illustrates drain current as a function of channel implant factor $\alpha$ with $V_d$=1V, L=0.5μm, Z=3μm and 1 Volt per step for gate voltage, $N_a$=5×10$^{16}$, $\mu_{oo}$=1200, $E_i$=2.5×10$^5$V/cm. FIG. 6B shows drain current as a function of channel implant factor $\alpha$ with $V_d$=0.5V, L=0.5μm, Z=3μm, 1 Volt per step for gate voltage, $N_a$=5×10$^{16}$, $\mu_{oo}$=1200, $E_i$=2.5×10$^5$V/cm. It is apparent that most of the change occurs when $\alpha = N_c/N_s < 2$. i.e., drain resistance decreases with increasing $\alpha$. $N_c$ is the implanted channel impurity concentration and $N_s$ represents the substrate impurity concentration, in Ions/cm$^3$. Accordingly, in designing Fermi-FET devices, one should strive to use a channel implant factor $\alpha$ of about 2.0.

Figures 7, 8:
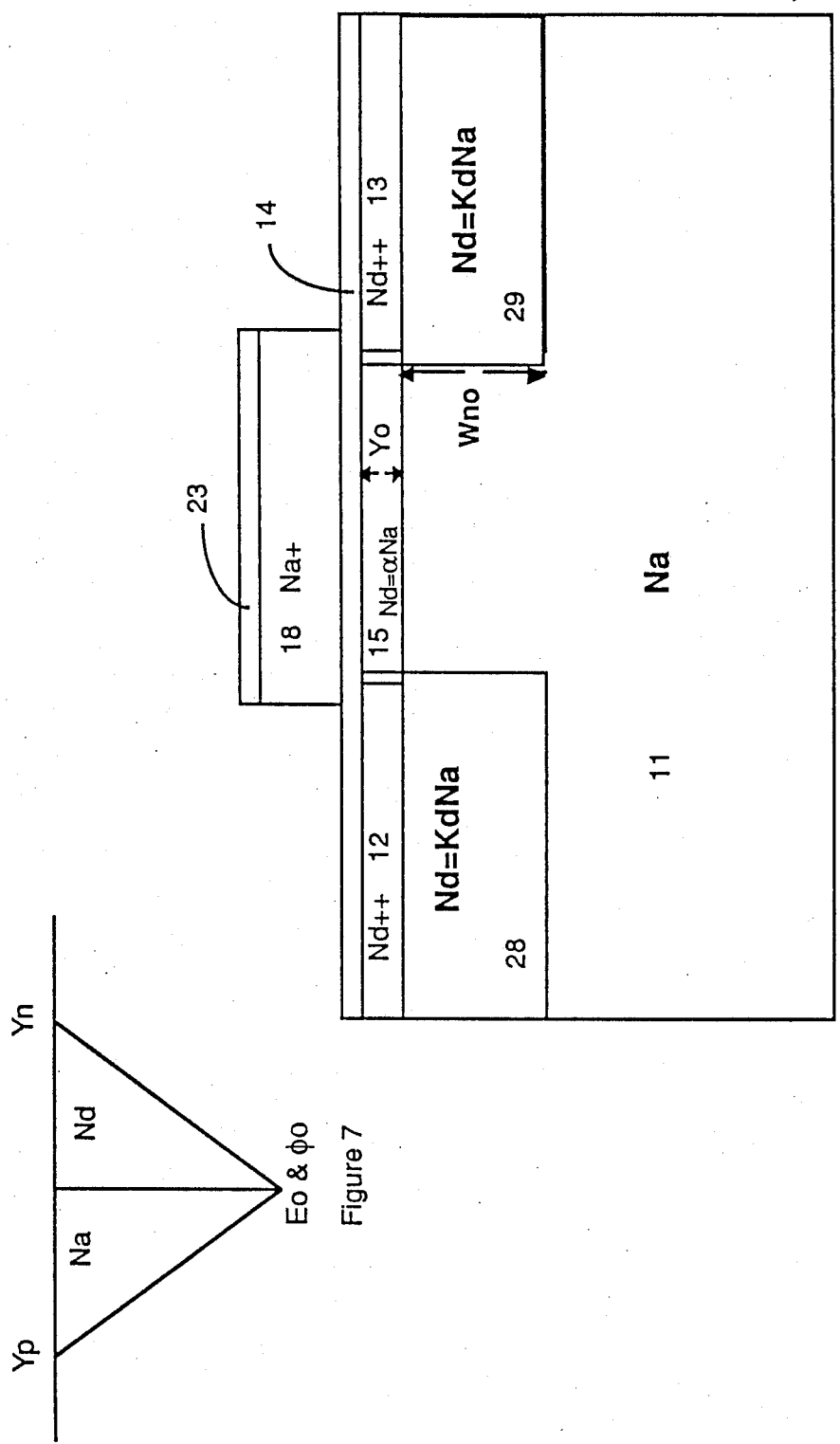
FIG. 7 graphically illustrates junction depletion for Fermi-FET devices of the present invention.
FIG. 8 illustrates a cross-sectional view of an FET having source and drain subdiffusion regions according to the present invention.

FIG. 7 illustrates the junction between the implanted channel 15 and the substrate 11 of FIG. 1A. The peak electric field $E_o$ and potential $\phi_o$ are shown at the stochastic junction between the implant and the substrate. The depletion depth developed in the substrate is $Y_p$ and the depleted implant depth is defined as $Y_n$. Since $$E_o = \frac{qN_a}{e_s} Y_p \tag{15}$$

and $$\phi_o = \frac{qN_a}{2e_s} Y_p^2, \tag{16}$$

therefore $$Y_p = \sqrt{\frac{2e_s}{qN_a} \phi_o} . \tag{17}$$

may be expressed in terms of surface potential $\phi_s$. From FIG. 7, the following is obtained:

$$\phi_s = \phi_o + \tfrac{1}{2} Y_n E_o. \tag{18}$$

Substituting for $E_o$:

$$\phi_s = \phi_o + \tfrac{1}{2} Y_n \frac{N_a}{N_d}\left(\frac{qN_a}{e_s}\right)Y_p. \tag{19}$$

Based on the definition of $\phi_o$, the following is obtained:

$$\phi_0 = \phi_s \frac{N_d}{N_d + N_a} \tag{20}$$

and $$Y_p = \sqrt{\frac{2e_s}{qN_a}\left(\frac{N_d}{N_d + N_a}\right)\phi_s} \tag{21}$$

Similarly $$Y_n = \sqrt{\frac{2e_s}{qN_d}\left(\frac{N_a}{N_d + N_a}\right)\phi_s} \tag{22}$$

Now, if the implant concentration varies in depth then:

$$E(y) = -\frac{q}{e_s}\int_0^Y N(y)dy, \tag{23}$$

and $$\phi_0 = \frac{q}{e_s}\int_0^{Y_n} dy \int_0^{Y_n} N(y)dy. \tag{24}$$

Multiplying Equation 24 top and bottom by $Y_n$ $$\phi_0 = \frac{q}{e_s}\int_0^{Y_n} Y_n dy \frac{1}{Y_n}\int_0^{Y_n} N(y)dy \tag{25}$$

The last integral in Equation 25 represents an average value. Thus, $$\phi_0 = \frac{q}{2e_s} Y_n^2 N_d^* \tag{26}$$

$$Y_n = \sqrt{\frac{2e_s}{qN_d^*}\phi_0} \tag{27}$$

Accordingly, the necessary conditions for the channel implant at depth $Y_n$ are:

$$\frac{1}{Y_n}\int_0^{Y_n} N_d(y)dy = N_d^* = \alpha N_a \tag{28}$$

After an anneal process depth spreading may be expected, so that:

$$\frac{1}{Y_n'} \int_0^{Y_n'} N_d(y)dy = N_d^{*'} \quad (29)$$

The integrals of Equations 28 and 29 must be the same since charge is conserved. Therefore, $$Y_n N_d = Y_n' N_d^{*'} \quad (30)$$

$$Y_n' = \frac{N_d}{N_d^{*'}} Y_n \quad (31A)$$

$$N_d^{*'} = \frac{Y_n}{Y_n'} N_d \quad (31B)$$

The depth of the depletion region in the substrate, $Y_p$ remains the same, before and after the anneal, since the total implant charge is unaltered.

$$q \int_0^{Y_n} N(y)dy = q \int_0^{Y'} N'(y)dy \quad (32)$$

Tables 2 and 3 illustrate values of implant channel depth $Y_o$ in cm for various values of $\alpha$ and $N_a$.

TABLE 2

| $\alpha = N_c/N_s$ | $Y_o$ @ $N_a = 1 \times 10^{16}$ | $Y_o$ @ $N_a = 1 \times 10^{17}$ |
|---|---|---|
| 1.0000000 | 2.0876457e-05 | 7.1460513e-06 |
| 1.2500000 | 1.7677658e-05 | 6.0474366e-06 |
| 1.5000000 | 1.5360821e-05 | 5.2522975e-06 |
| 1.7500000 | 1.3597864e-05 | 4.6475990e-06 |
| 2.0000000 | 1.2207786e-05 | 4.1710276e-06 |
| 2.2500000 | 1.1081721e-05 | 3.7851283e-06 |
| 2.5000000 | 1.0149919e-05 | 3.4659164e-06 |
| 2.7500000 | 9.3654684e-06 | 3.1972686e-06 |
| 3.0000000 | 8.6955825e-06 | 2.9679200e-06 |
| 3.2500000 | 8.1166127e-06 | 2.7697490e-06 |
| 3.5000000 | 7.6110519e-06 | 2.5967449e-06 |
| 3.7500000 | 7.1656491e-06 | 2.4443597e-06 |
| 4.0000000 | 6.7701829e-06 | 2.3090859e-06 |
| 4.2500000 | 6.4166374e-06 | 2.1881738e-06 |
| 4.5000000 | 6.0986353e-06 | 2.0794361e-06 |
| 4.7500000 | 5.8110371e-06 | 1.9811105e-06 |
| 5.0000000 | 5.5496537e-06 | 1.8917608e-06 |
| 5.2500000 | 5.3110354e-06 | 1.8102046e-06 |
| 5.5000000 | 5.0923150e-06 | 1.7354593e-06 |
| 5.7500000 | 4.8910894e-06 | 1.6667014e-06 |

TABLE 3

| $\alpha = N_c/N_s$ | $Y_o$ @ $N_a = 3 \times 10^{16}$ | $Y_o$ @ $N_a = 6 \times 10^{16}$ |
|---|---|---|
| 0.50000000 | 2.0226885e-05 | 1.4648398e-05 |
| 0.75000000 | 1.5399139e-05 | 1.1148451e-05 |
| 1.0000000 | 1.2537030e-05 | 9.0743104e-06 |
| 1.2500000 | 1.0612724e-05 | 7.6801600e-06 |
| 1.5000000 | 9.2194980e-06 | 6.6709817e-06 |
| 1.7500000 | 8.1596633e-06 | 5.9034214e-06 |
| 2.0000000 | 7.3241990e-06 | 5.2984395e-06 |
| 2.2500000 | 6.6475555e-06 | 4.8085218e-06 |
| 2.5000000 | 6.0877463e-06 | 4.4032386e-06 |
| 2.7500000 | 5.6165406e-06 | 4.0621323e-06 |
| 3.0000000 | 5.2142104e-06 | 3.7709088e-06 |
| 3.2500000 | 4.8665300e-06 | 3.5192616e-06 |
| 3.5000000 | 4.5629693e-06 | 3.2995624e-06 |
| 3.7500000 | 4.2955597e-06 | 3.1060392e-06 |
| 4.0000000 | 4.0581550e-06 | 2.9342402e-06 |
| 4.2500000 | 3.8459362e-06 | 2.7806752e-06 |
| 4.5000000 | 3.6550694e-06 | 2.6425677e-06 |
| 4.7500000 | 3.4824655e-06 | 2.5176806e-06 |
| 5.0000000 | 3.3256069e-06 | 2.4041908e-06 |
| 5.2500000 | 3.1824202e-06 | 2.3005973e-06 |

Controlling Punch-through and Avalanche Breakdown Voltage

There are two voltage breakdown phenomena that limit the success of short channel FET technology. Punch-through occurs when the depletion boundary surrounding the drain touches the depletion boundary surrounding a grounded source. This condition causes injection to occur at the source-substrate junction. Impact ionization occurs when drain voltage reaches a value that stimulates the generation of electron-hole pairs at the junction between the drain diffusion and substrate. Electron-hole pair generation gives rise to an avalanche break-down mechanism that produces a rapid increase in drain current. Substrate current flows when avalanche breakdown occurs in support of the increase in drain current.

According to the invention, substrate dopant level and the subdiffusion - drain implant doping factor $K_d$, may be used to simultaneously control both voltage breakdown mechanisms.

Referring now to FIG. 8, an FET structure having subdiffusion regions to minimize punch-through and avalanche breakdown is shown. P-doped substrate 11 has an acceptor concentration $N_a$. Source and drain regions 12 and 13 respectively are heavily doped N-type regions. N-doped channel 15 has doping concentration $N_d$. In a preferred embodiment channel 15 meets the requirements of a Fermi-FET Equation 3A, although a conventional FET may also be employed. Associated with source 12 and drain 13 are source and drain subdiffusion regions 28 and 29, respectively, having donor doping concentrations $N_d = K_d N_a$. It will be understood by those having skill in the art that punch-through and avalanche breakdown are more likely to occur at the drain rather than the source, so that a drain subdiffusion 29 alone may be employed.

The value of the subdiffusion implant doping factor $K_d$ will now be described. Increasing punch-through break-down requires increasing substrate doping $N_a$. On the other hand, breakdown voltage due to impact ionization is inversely dependant on substrate doping. The solution to this dilemma is to control the dopant concentration $K_d$ of the subdiffusion region, FIG. 8, in the vicinity of the substrate such that the peak field crossing the substrate to subdiffusion junction is minimized for a given drain voltage. The ionization field of approximately $3 \times 10^5$ Volts per cm is eventually reached for some drain voltage. The object is to operate Fermi-FET devices below this field value with as high a drain voltage as possible. Equation 33 below describes avalanche break-down as a function of the ionizing field $E_i$, substrate doping $N_a$, and diffusion dopant concentration $K_d$:

$$V_A = \frac{E_i^2 \epsilon_s}{2 q N_a} \left( \frac{K_d + 1}{K_d} \right) \quad (33)$$

$$V_p = V_0 \left[ \left( \frac{L}{\sqrt{\frac{2\epsilon_s V_0}{q N_a} \left( \frac{K_d}{K_d + 1} \right)}} - 1 \right)^2 - 1 \right] \quad (34)$$

$$K_d = \frac{N_d}{N_a} \quad (35)$$

$$W_{no} = \sqrt{\frac{2e_s(V_0 + V_p)}{qN_aK_d(K_d + 1)}} \quad \text{Minimum Depth For Subdiffusion} \quad (36)$$

$$V_0 = \frac{KT}{q} \text{Ln}\left(\frac{K_dN_a^2}{N_i^2}\right) \text{Contact Potential} \quad (37)$$

Figure 9A:
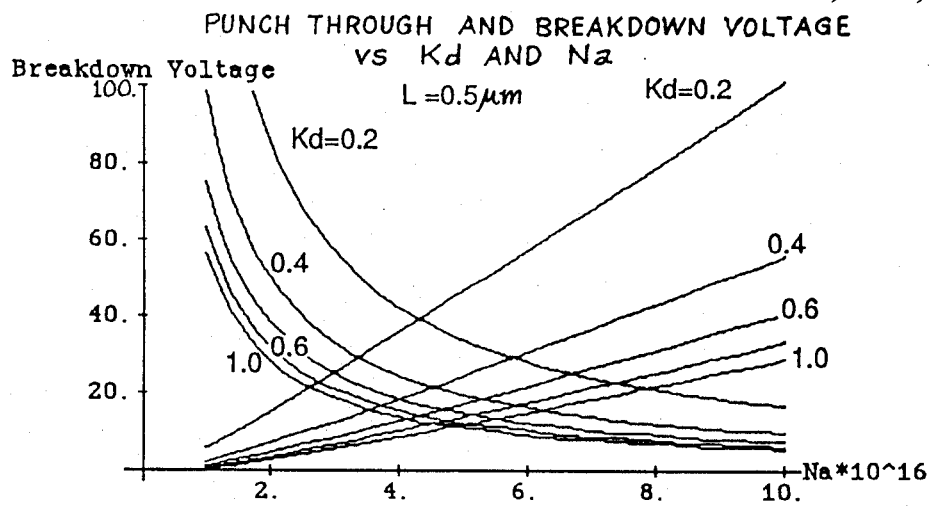
FIGS. 9A–9F graphically illustrate maximizing avalanche and punch-through breakdown voltages according to the present invention.

Equation (34) describes breakdown voltage $V_p$ due to the punch-through mechanism. The dependance of these breakdown mechanisms on substrate doping has opposite effects. One voltage increases while the other decreases. Maximum substrate doping occurs when Equations 34 and 35 are equal, for a given subdiffusion concentration factor $K_d$. The drain sub-diffusion concentration factor $K_d$, for dopant concentration below the depth of the implanted channel region of the Fermi-FET, has a pronounced effect on drain breakdown voltage. This effect is illustrated in FIG. 9A. Breakdown is illustrated for several values for the concentration factor $K_d$. The nominal value $E_i$ for silicon is $2.5 \times 10^5$ V/cm at room temperature for the computed range of substrate doping $N_a$. Channel length L was 0.5μm. The minimum value for the subdiffusion implant depth $W_{no}$, (FIG. 8), was computed assuming complete depletion at a drain voltages $V_d=10V$ and 6V and is defined in FIG. 9D and 9E respectively as a function of $N_a$ and $K_d$.

Referring to FIG. 9A, both punch-through (rising curve) and avalanche breakdown voltage (falling curve) are shown as a function of $K_d$ and $N_a$. Their intersection specifies the maximum substrate doping level $N_a$ that simultaneously maximizes both breakdown voltages. Factor $K_d$ is shown in the range $0.2 < K_d < 1$. Higher breakdown voltage occurs when $K_d=0.2$. The channel is 0.5μm long. Ionization field $E_i=2.5 \times 10^5$ V/cm. It is apparent that a breakdown of 20 Volts is quite possible for this channel length.

Figure 9B:
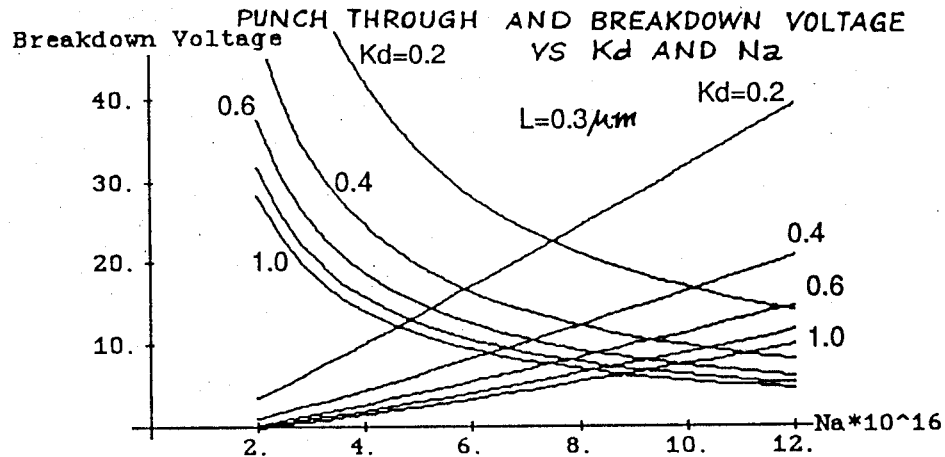

Referring to FIG. 9B, both punch-through (rising curve) and avalanche breakdown voltage (falling curve) is shown. Their intersection specifies the substrate doping level $N_a$ that maximizes both breakdown voltages. $K_d$ is shown in the range $0.2 < K_d < 1$. The highest breakdown voltage occurs when $K_d=0.2$. The channel is 0.3 μm long. It is apparent that a breakdown of 20 Volts is quite possible for this channel length.

Figure 9C:
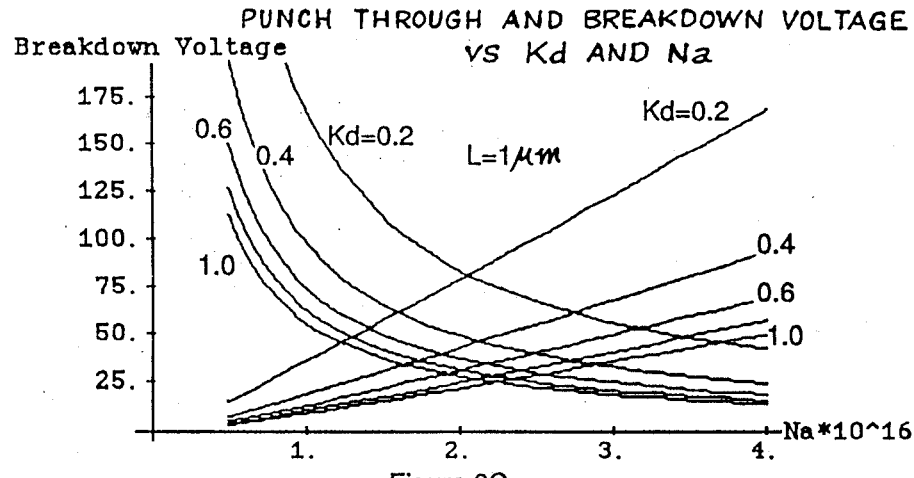
Figure 9D:
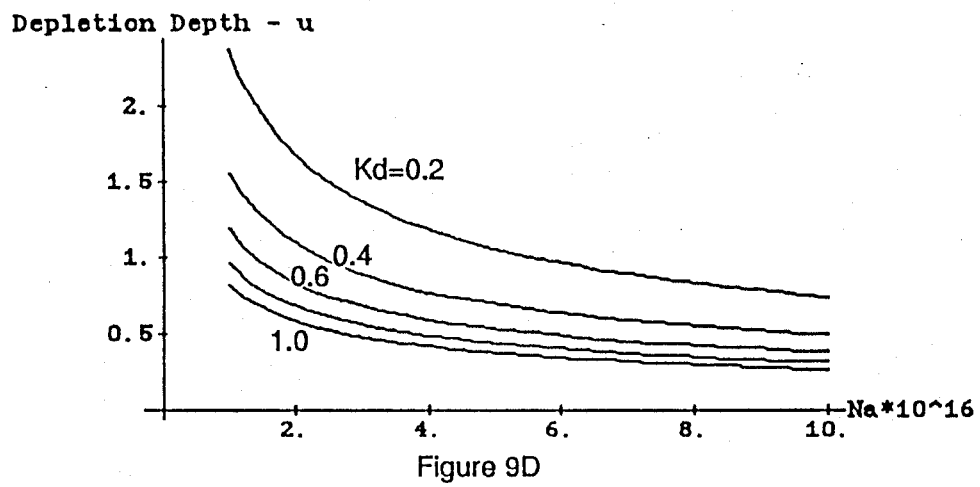
Figure 9E:
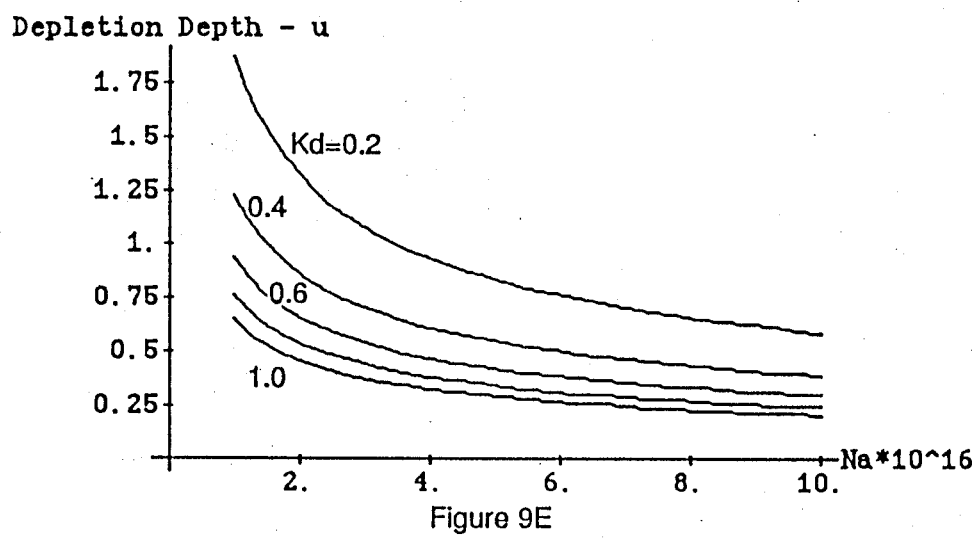

Referring now to FIG. 9C, both punch-through (rising curve) and avalanche breakdown voltage (falling curve) are shown for a channel $L=1\mu m$. FIGS. 9D and 9E illustrate the minimum depth $W_{no}$ of the sub-diffusion region given 10 and 6 Volts on the drain for full depletion, respectively. The highest running parameter is $K_d=0.2$. The lowest is $K_d=1.0$ Subdiffusion concentration factor $K_d$ should correspond approximately to twice the channel length L in number value. For example, if $L=0.5\mu m$, then $K_d=1$. Under these circumstances, break-down voltage is about 10V for $E_i 2.5 \times 10^5$ V/cm. The nominal substrate dopant concentration $N_a$ is about $4.6 \times 10^{16}$ cm$^{-3}$ for a channel length, $L=0.5\mu m$, $N_a=8 \times 10^{16}$ for $L=0.3$ μm, and $N_a=2 \times 10^{16}$ for a channel length of 1μm.

The channel implant factor $\alpha$ for the Fermi-FET is based on substrate concentration $N_3$ and the desired channel depth $Y_o$. The nominal value for $\alpha$ is about 2.0. The heavily doped drain and source contact diffusions, FIG. 8, should have the same depth as the channel, and have resistivity less than 200Ω per square. Some latitude in this depth is provided by the choice of the channel implant factor $\alpha$. For example, the source and drain contact diffusions may be up to twice as deep as the channel depth $Y_o$.

Figure 9F:
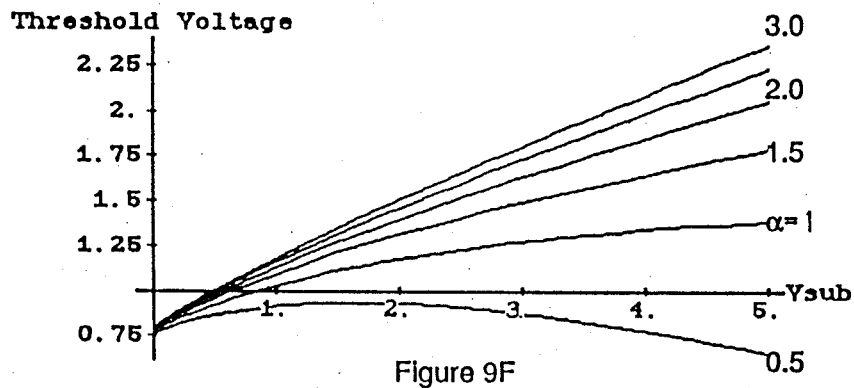

The Fermi-FET body effect, i.e. threshold voltage variation with substrate voltage, is dramatically influenced by the channel implant factor $\alpha$. This influence by factor $\alpha$ is unique to the Fermi-FET and is illustrated in FIG. 9F for $N_s=N_a=5\times10^{16}$/cm$^3$. FIG. 9F illustrates threshold voltage as a function of substrate voltage given $N_a=5\times10^{16}$ and channel factor c as the running parameter; $\alpha=a^*n$, $a=0.5$. Note that threshold is fairly flat if $\alpha=0.7$, $T_{ox}=120A$.

Ohmic Contact Junction Potential Compensation

Figure 10A:
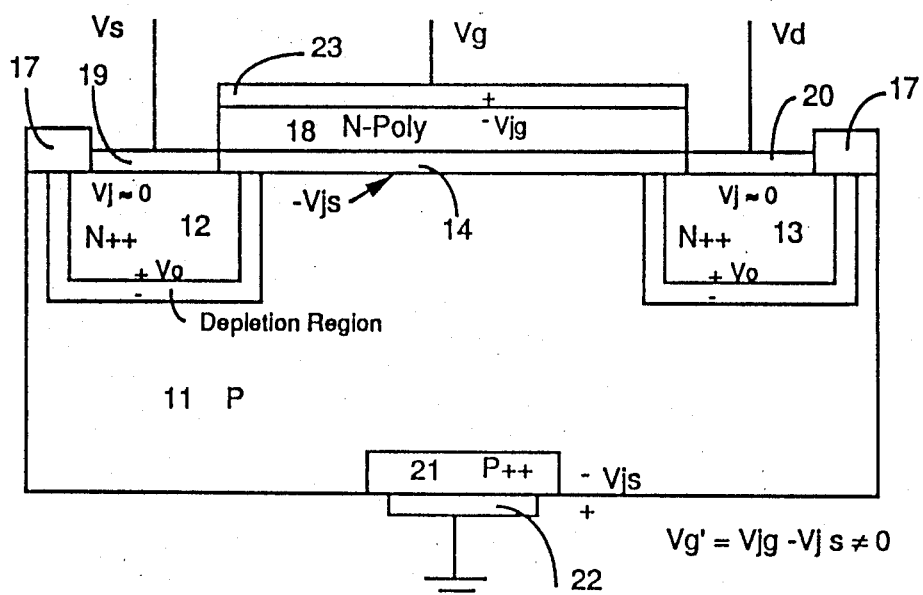
FIGS. 10A–10D illustrate cross-sectional views of flat-band voltage compensation according to the present invention.
Figure 10B:
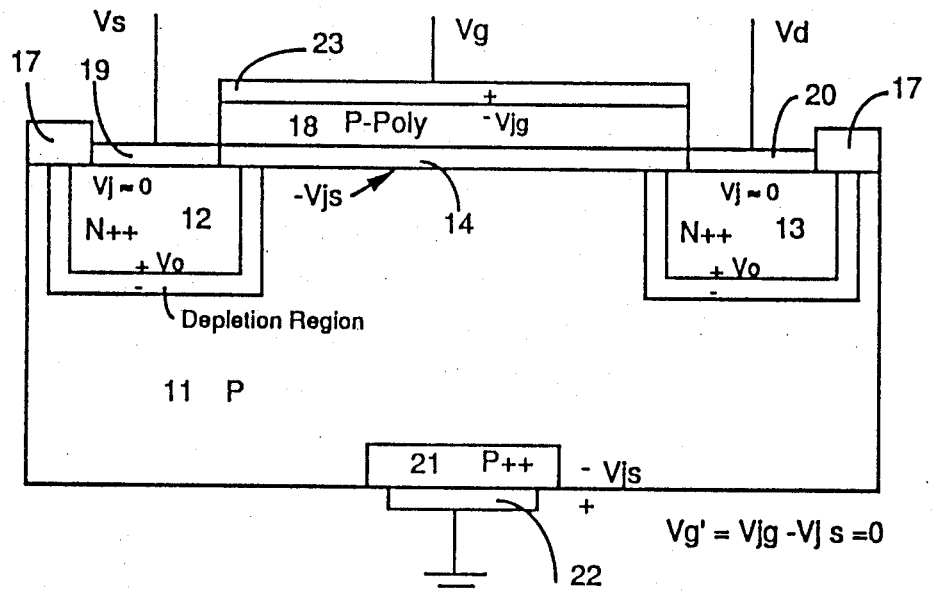
Figure 10C:
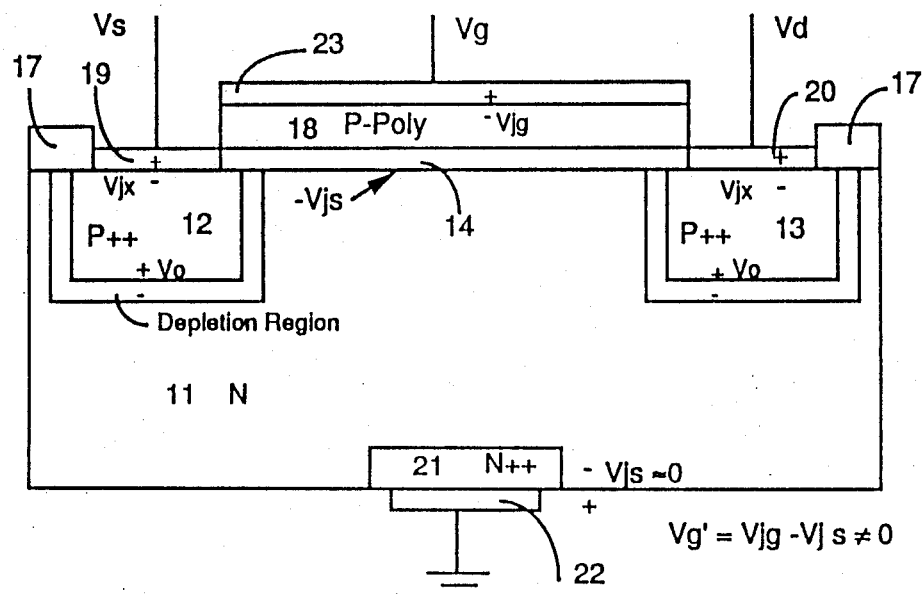
Figure 10D:
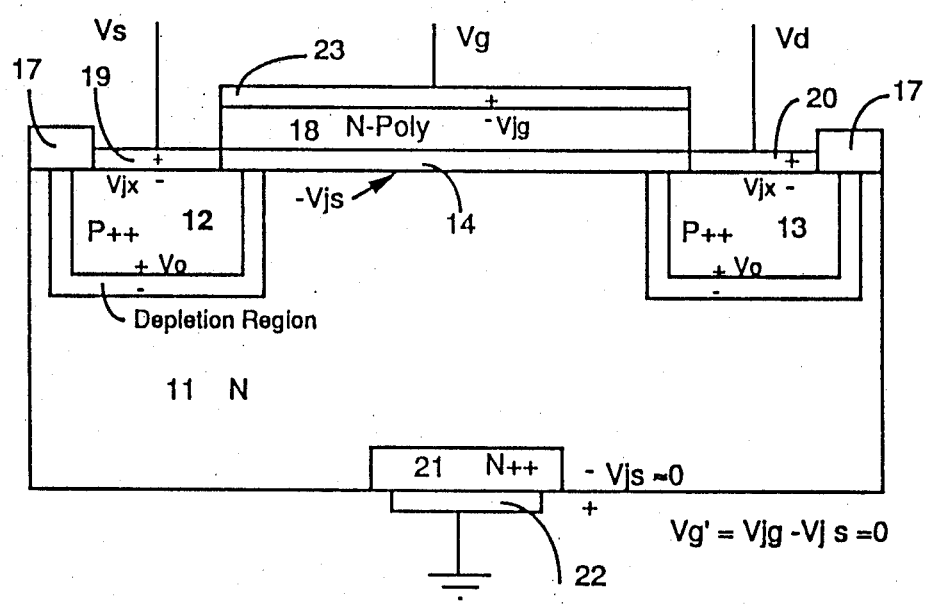

The effect of junction potentials of ohmic metal semiconductor contacts on threshold voltage and FET design will now be described. FIGS. 10A-10D illustrate various contact potentials that occur at the substrate-metal, diffusion-metal, and polysilicon gate-metal junctions. FIGS. 10A-10B illustrate N-channel devices and FIGS. 10C-10D illustrate P-channel devices.

The analysis heretofore presented assumes that drain, source, and gate voltages are referenced to the substrate potential. No provisions were made to include effects of metal contact potentials. It will become apparent from the following analysis that metal-poly gate contact potential may be employed to compensate for metal-substrate flat-band voltage for both conventional and Fermi-FET devices. It will be shown that the doping polarity and concentration of the polysilicon gates, for both P- and N-channel devices, may be chosen to compensate for substrate contact potential, thus eliminating this undesired source of threshold voltage.

Referring to the N-channel technology, FIGS. 10A and 10B, contact to the substrate 11 is made by depositing metal 22 on a heavily doped P++ region 21 provided at the surface of the substrate 11. A potential is developed across this P++ metal junction. The potential $V_{jx}$ given below for metal to P- and N-type diffusions:

$$V_{jxp} = \frac{KT}{q} \ln\left(\frac{N_d'N_a}{N_i^2}\right) \quad (38A)$$

$$V_{jxn} = \frac{KT}{q} \text{Ln}\left(\frac{N_d'}{N_d}\right) \quad (38B)$$

$N_a$ is the acceptor concentration of the P++ pocket, $N_d$ is the donor concentration, and $N_d'$ is the effective density of conduction electrons in the contacting metal. The depletion depth within the P++ pocket region, resulting from metal contact, must be shallow by design to allow electron tunneling to occur in order to achieve Ohmic-contact properties of the metal-semiconductor junction. Depletion depth within the P++ pocket region is approximated by:

$$X_d = \sqrt{\frac{2e_sV_j}{qN_a}\left(\frac{N_d'}{N_d'+N_a}\right)} \quad (39)$$

This depletion depth needs to be less than about $1.5\times10^{-5}$ cm in order to support the tunneling mechanism. Assuming $N_d'=10^{21}$ cm$^{-3}$ and $N_a=10^{19}$ cm$^{-3}$, then $V_{jx}=1.17$ Volts, $X_d=1.17\times10^{-6}$cm, and the electric field at the junction is $qN_aX_d/e_s=1.87\times10^6$V/cm. A significant result is realized when the aluminum - substrate contact is grounded. This ground connection places the substrate potential below true ground potential. i.e. $-V_{js}$.

Accordingly, to assess true MOSFET threshold voltage, of the quiescent substrate to gate voltage must be considered. Referring to FIG. 10A, the N-polysilicon gate-metal contact potential, $KT/q \ln(N/N_d)$, is negligible, (for example 150 mv) and assumed to be small compared to $V_{js}$. Therefore, grounding the gate yields a net positive gate-to-substrate voltage $V_{js}=1.02$ Volts. Therefore, the total MOSFET threshold voltage is reduced by the difference in contact potential, $V_{js}-V_{jg}$. Given a grounded source N-channel Fermi-FET provided with a N-poly gate, threshold voltage $V_t$ would be $V_t=2\phi_f-V_{js}$ and quite likely, threshold voltage will have a net negative value.

Referring now to FIG. 10B, it is shown that the polygate 18 is doped P++. If the doping density of the polysilicon gate body region is identical to the substrate doping, and aluminum is used in both cases for contacts 22 and 23, the polysilicon-aluminum contact potential will match the metal-substrate junction voltage $V_{jx}$. For this case, when the gate electrode 23 is grounded, the net contact induced threshold potential is $V_{jg}-V_{js}=0$. Thus, no extraneous threshold potential exists due to contacts, for any N-channel MOSFET configured with a P-polysilicon gate. The grounded source Fermi-FET device will simply have a threshold voltage $V_t=2\phi_f$. Thus, an N-channel Fermi-FET structure needs a P-polysilicon gate to eliminate contact potentials from affecting threshold voltage.

The unconnected source and drain diffusion potential $V_j$ of the N-channel device is $V_j=V_o-V_{js}$ where $V_o$ is the source or drain diffusion-substrate junction potential. The potential contour integral through the substrate, from contact 19 to contact 22, is zero if the same metal is used for both contacts. Grounding the diffusion-aluminum contact and substrate contact slightly reverse biases the diffusion - substrate junction.

Referring now to FIGS. 10C and 10D, a P-channel device is illustrated. Substrate contact is made by depositing aluminum 22 on an N++ pocket 21 implanted at the surface of an N-type substrate 11. The junction potential $V_j$ of this Ohmic contact is given by Equation 38B, since both materials are majority N-type. Therefore, grounding the aluminum contact 22, places the substrate surface, under the gate, slightly below ground potential.

Referring to FIG. 10C, an aluminum contact 23 is made to a P-polysilicon gate. A junction potential $V_{jg}$ is developed across this contact that is similar in value to $V_{js}$ developed at the P-substrate-aluminum contact (FIG. 10B). Therefore, grounding the P-channel gate places the gate potential, $-V_{jg}$, below the surface potential of the substrate, thereby lowering the threshold voltage of the P-channel device by this junction potential. This offset in threshold voltage is eliminated by the structure shown in FIG. 10D. In that structure, an N-poly gate is used with a P-channel device Any junction potential $V_{jp}$ developed across the aluminum - N-polysilicon junction can be made to be identical to the aluminum - substrate junction potential $V_{js}$. Grounding the aluminum contact on the N-poly gate eliminates gate-to substrate-potential, and therefore no extraneous threshold voltage term exists due to metal contacts.

In conclusion, a significant contact potential exists between aluminum and P++ semiconductor material. In order to avoid introducing this contact potential as part of the threshold voltage, the following FET conditions must be met: N-channel FET's require a P-polysilicon gate, while P-channel FET's require an N-polysilicon gate.

The above described matching of implant doping eliminates extraneous threshold voltage as well as thermally introduced variations. It will be understood by those having skill in the art that the prior art has ignored or not totally understood the full implications of metal-semiconductor contact potentials (flat-band voltage).

Threshold voltage Sources - Summary

Equations (40) and (46) reveal all important sources of threshold voltage for N- and P-channel FET devices.

N-Channel Technology $$V_t = \phi_s + \frac{1}{C_i}\sqrt{2e_sqN_a\phi_s} - V_{cs} + V_{cg} \quad (40)$$

$$V_{cs} = \frac{KT}{q}\ln\left(\frac{N^- N_a}{N_i^2}\right) \quad (41)$$

$$\phi_s = \frac{KT}{q}\ln\left(\frac{N_a}{N_i}\right)^2 = 2\phi_f \quad (42)$$

$$V_{cg} = 0 \text{ if metal gate} \quad (43)$$

$$V_{cg} = \frac{KT}{q}\ln\left(\frac{N^-}{N_d}\right) \text{ if N-Poly} \quad (44)$$

$$V_{cg} = \frac{KT}{q}\ln\left(\frac{N^- N_a}{N_i^2}\right) \text{ if P-Poly} \quad (45)$$

P-Channel Technology $$V_t = \phi_s - \frac{1}{C_i}\sqrt{2e_sqN_d\phi_s} - V_{cs} + V_{cg} \quad (46)$$

$$\phi_s = \frac{KT}{q}\ln\left(\frac{N_a}{N_i}\right)^2 = 2\phi_f \quad (47)$$

$$V_{cs} = \frac{KT}{q}\ln\left(\frac{N^-}{N_d}\right) \quad (48)$$

$$V_{cg} = 0 \text{ if metal gate} \quad (49)$$

$$V_{cg} = \frac{KT}{q}\ln\left(\frac{N^-}{N_d}\right) \text{ if N-Poly} \quad (50)$$

$$V_{cg} = \frac{KT}{q}\ln\left(\frac{N^- N_a}{N_i^2}\right) \text{ if P-Poly} \quad (51)$$

For the conventional grounded source enhancement FET, there are four separate threshold voltage terms. From left to right they are; surface potential $\phi_s$, oxide potential $V_{ox}$, flat-band voltage at the substrate-metal Ohmic contact $V_{cs}$, and flat-band voltage at the polysilicon gate Ohmic contact $V_{cg}$. Comparing Equation 40 with Equation 46, for N- and P-channel devices, it is evident that the polarity of both flat-band voltage terms is unaltered. Their magnitudes, however, are different.

Fermi-FET device design according to the present invention completely eliminates oxide potential $V_{ox}$, the second term in Equations 40 and 46. However if the channel of the Fermi-FET is implanted with a dose greater than the nominal value, a fraction of the oxide potential term reappears but with a polarity opposite that indicated in Equation 40 and 46, as will be described below in connection with modifying Fermi-FET threshold voltage.

By examining Equations 40 and 46, it may be seen that threshold voltage for the Fermi-FET reduces to surface potential $\phi_s$, if both substrate and poly-gate flat-band voltages cancel one another. Equations 43 through 45 give expressions for poly-gate flat-band voltage $V_{cg}$ for N-channel devices, given a metal gate, and N+ or P+ polysilicon gates. Equations 48 through 51 give the appropriate expressions for P-channel devices. The net flat-band voltage, $V_{fb}=V_{cs}-V_{cg}$, approaches zero if the N-channel device is provided with a P-poly gate and the P- channel device is provided with an N-poly gate. Note that the dopant concentration at the surface of the poly gates must be high enough to achieve ohmic-metal contacts. The intrinsic carrier concentration $N_1^*$ of polysilicon is greater than that in crystalline silicon by about an order of magnitude. It is estimated that that the intrinsic carrier concentration $N_i^*$ in polysilicon is about $1.8 \times 10^{11}$ cm$^{-3}$ at 300 degrees Kelvin. This value should be used when calculating flat-band voltage at metal - poly gate junctions.

Finally, it will be understood from the above analysis that conventional N- and P-channel FET devices should avoid use of metal gates. Instead they should be provided with contra-doped poly gates in order to achieve symmetric fabrication and equal threshold voltage. However, only the Fermi-FET device design eliminates oxide voltage from the threshold expression thereby attaining all of the performance advantages previously described.

The above analysis may be applied to specific examples as follows:

Case 1: Metal gate P- and N-channel MOS devices

Threshold voltage for metal gate N- and P-channel devices becomes

N-Channel $$V_{tn} = \phi_s + \frac{1}{C_i} \sqrt{2e_s q N_a \phi_s} - V_{cs}$$

P-Channel $$V_{tn} = -\phi_s - \frac{1}{C_i} \sqrt{2e_s q N d \phi_s} - V_{cs}$$

$$C_i = \frac{e_i}{T_{ox}}$$

Flat-band voltage at the N-channel - substrate contact $V_{cs}$ is approximately 1.0 Volt, and depends on substrate acceptor concentration $N_a$. For the P-channel device, $V_{cs}$ is about 0.2V depending on donor concentration $N_d$, assuming that surface potential $\phi_s=2\phi_f$ and therefore is about 0.7V. For the N-channel device, threshold voltage becomes;

$$V_{tn} = -0.3 + \frac{1}{C_i} \sqrt{2e_s q N_a \phi_s}$$

Threshold voltage for the P-channel device becomes;

$$V_{tn} = -0.9 - \frac{1}{C_i} \sqrt{2e_s q N_d \phi_s}$$

The oxide potential term is all that remains to control threshold voltage. For the N-channel case, oxide potential needs to be about 1.0 V at inversion. Two options are available to attain this voltage; i.e. use thick oxide, and/or implant additional acceptor ions at the channel surface. This solution for the N-channel threshold voltage yields a device very sensitive to short channel and hot electron effects. The P-channel device has a different problem. Threshold voltage is too high even if oxide potential is zero. The only practical solution for a conventional P-channel device is to use an N-poly-gate to eliminate flat-band voltage effects. The result is;

$$V_{tp} = -0.7 - \frac{1}{C_i} \sqrt{2e_s q N_d \phi_s}$$

Case 2: N-Poly gates used for both P- and N-channel devices

As in Case 1, the net flat-band voltage is zero for the p-channel device. Its threshold voltage expression reduces to the following:

$$V_{tp} = -\phi_s - \frac{1}{C_i} \sqrt{2e_s q N_d \phi_s}$$

To reduce the contribution of the oxide potential term, the surface of the substrate, in the channel region, can be compensated with donor ions.

The N-channel device has a different problem. The net flat-band voltage $(-V_{cs}+V_{cg})$ is about 0.8 volts. Threshold voltage becomes:

$$V_{tn} = -0.1 + \frac{1}{C_i} \sqrt{2e_s q N_a \phi_s}$$

The oxide potential term can be adjusted as in Case 1 by increasing the donor concentration $N_a$ in the channel region.

As in Case 1, this is a poor solution since the device is still sensitive to short channel and hot electron effects because of the large oxide potential term.

Case 3: N-channel device with P-poly gate and P-channel device with N-poly gate

These combinations eliminate flat-band voltage and lead to balanced threshold voltages for the P- and N-channel devices.

$$V_{tn} = \phi_s + \frac{1}{C_i} \sqrt{2e_s q N_a \phi_s}$$

$$V_{tn} = -\phi_s - \frac{1}{C_i} \sqrt{2e_s q N_d \phi_s}$$

Increasing substrate doping $N_a$ for the N-channel device and $N_d$ for the P-channel device, is one method to control punch-through voltage for short channel devices. Unfortunately when used for conventional FET devices, this technique increases oxide potential, thus requiring channel surface compensation to be used to minimize the effect.

Case 4: Fermi-FET with contra doped polysilicon gates

The threshold voltage for the N- and P-channel devices are:

$$V_{tn} = +\phi_s = 2\phi_f$$

$$V_{tp} = -\phi_s = -2\phi_f$$

This simplicity comes about since oxide potential is zero by design and all flat-band voltages are cancelled. Under these ideal circumstances, both P- and N-channel Fermi-FET's can be optimized for punch-through and avalanche breakdown and maximized for transconductance without affecting threshold voltage. Of great importance is the insensitivity to short channel effects including hot electron trapping. Finally, Fermi-FET devices fabricated with channel length's as short as 0.3 μm should not require scaling down the standard power supply voltage of 5 volts.

Modifying Fermi-FET Threshold Voltage

For some circuit designs, it is desirable to fabricate depletion mode Fermi-FET devices A depletion mode device is fabricated like an enhancement Fermi-FET device except the channel implant dose is increased by factor G while maintaining the same implant energy needed to achieve the critical implant depth prescribed by Equation 3A. By using Poisson's Equation to calculate surface potential at X=0 when excess dose factor $G_i$ is present, and given the nominal implant depth $Y_o$, the threshold voltage $V_{td}$ for a depletion mode or low threshold device may be defined in terms of the excess implant factor $G_i$ as follows:

$$V_{td} = \phi_s \left[ 1 - \frac{G_i}{\alpha + 1} \right] - \frac{G_i}{C_i} \sqrt{2qNe_s \left( \frac{\alpha}{\alpha + 1} \right) \phi_s} \quad (52)$$

Where $$\phi_s = 2\phi_f + \frac{KT}{q} \ln(\alpha)$$

$$\phi_f = \frac{KT}{q} \ln\left( \frac{N_a}{N_i} \right)$$

Figure 11A:
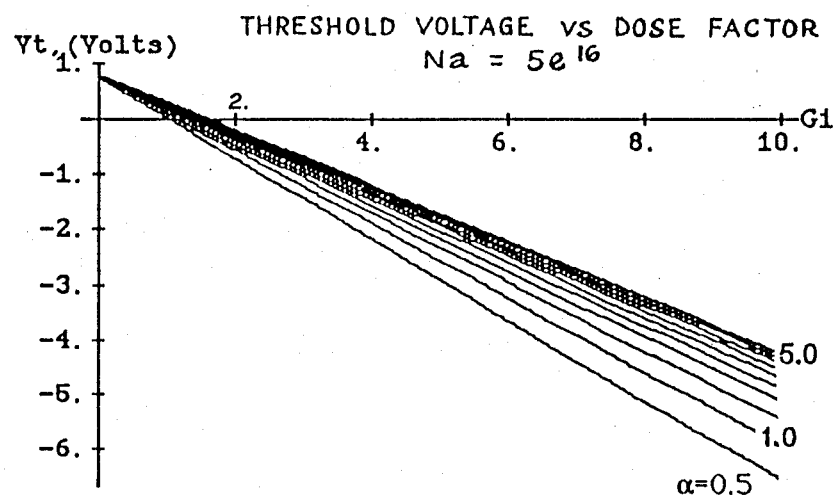
FIGS. 11A–11C graphically illustrate the use of a dose factor to vary the threshold voltage of the Fermi-FET of the present invention.

Equation 52 is plotted in FIG. 11A as a function of $G_i$ for different values of channel implant factor $\alpha$ with a silicon substrate doped with $5e^{16}$ acceptor ions per cm³ and having an thickness of 120 Å. All threshold voltage values that are negative, correspond to an equivalent imaginary gate voltage responsible for conduction of the undepleted portion of the implant channel. For N-channel devices, a negative voltage is required to shut-off the channel. For example, given a substrate impurity concentration of $5e^{16}$ cm⁻³ and $G_i=4$, and $\alpha=2$, the channel conducts as though it was an enhancement device supplied with an effective gate voltage 1.3 volts above threshold. A gate voltage of −1.3 Volts is required to terminate N-channel conduction. Accordingly, FIG. 11A defines the additional implant dose factor $G_i$ required to modify a Fermi-FET device to have depletion mode properties or to lower its positive threshold voltage below the Fermi value $\phi_s$.

Figure 11B:
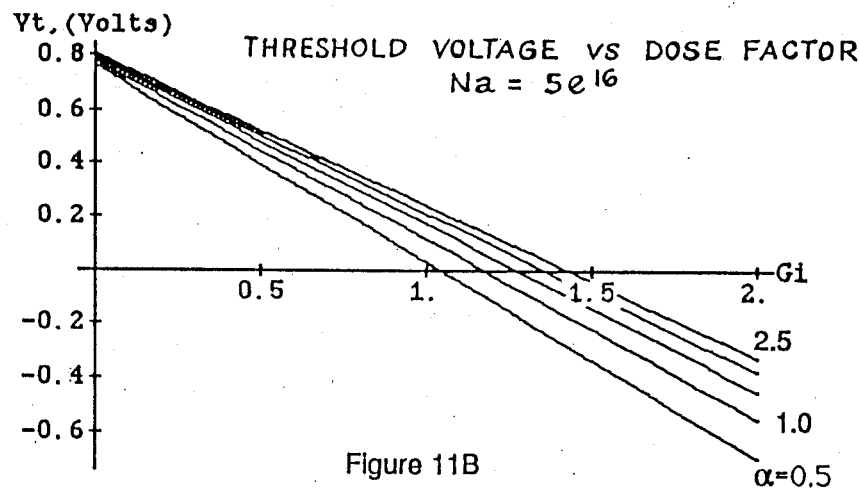
Figure 11C:
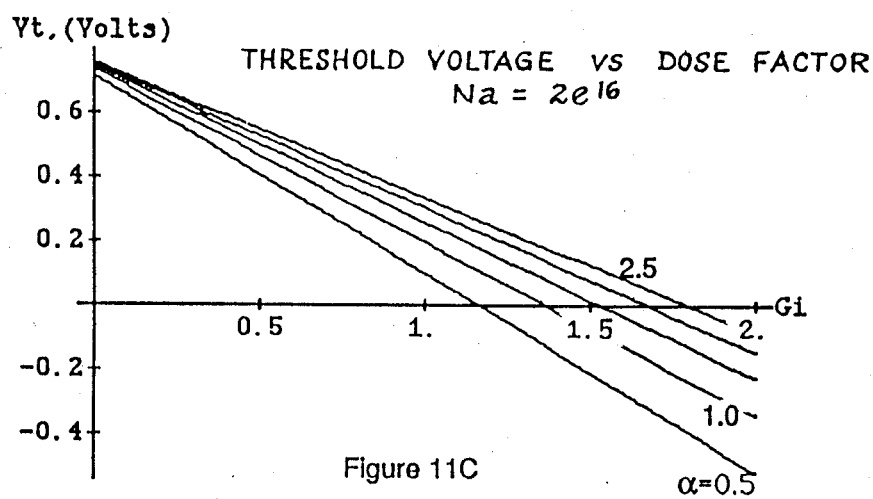

Referring to FIGS. 11B and 11C, it is shown that a positive threshold voltage may be achieved, for an N-channel Fermi-FET device, that is below the Fermi value $\phi_s$. This is accomplished by using an excess implant dose factor $G_i$, restricted to a value less than about 2.0. FIG. 11B uses the same parameters as FIG. 11A, except the $V_t$ and $G_i$ scales are changed. FIG. 11C uses the same parameters as FIGS. 11A and 11B, except that $N_a = 2e^{16}$. The same excess dose procedure may be employed to lower threshold voltage of P-channel Fermi-FET devices. Opposite voltage polarities apply for P-channel devices.

Effective Channel Length in FETs

Previous analysis employed an effective channel length L*. The origin of this term will now be described in connection with the formation of a channel by application of gate voltage $V_g$, when the depletion regions already surround the drain and source diffusions.

Figure 12A:
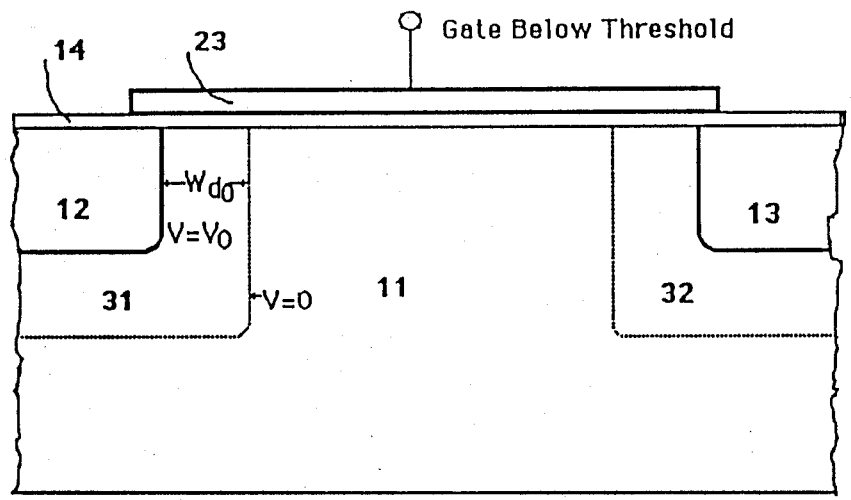
FIGS. 12A–12B illustrate cross-sectional views of effective channel length of FET's according to the present invention.

Referring now to FIG. 12A, a MOSFET is shown having a depletion configuration without a channel, and with source 12 and drain 13 at ground potential and gate 23 below threshold. FIG. 12A illustrates depletion regions 31 and 32 respectively, in the substrate 11, surrounding the source and drain diffusions 12 and 13 respectively, resulting from these P-N junctions. A junction voltage $V_o$, appears on the diffusion at the stochastic junction between the diffusion and the substrate. This voltage is the result of achieving a constant Fermi potential across the junction. Junction voltage $V_o$ is given below for an abrupt junction:

$$V_0 = \frac{KT}{q} \ln\left( \frac{N_a N_d}{N_i^2} \right) \quad (53)$$

The width $W_d$ of the depletion region (31 or 32) extending into the P-substrate from the drain or source diffusions is expressed as follows:

$$W_{dp} = \sqrt{ \frac{2e_s V_0}{q} \left[ \frac{N_d}{N_a (N_a + N_d)} \right] } \quad (54)$$

If the donor concentration $N_d$ the drain and source diffusions is much greater than acceptor concentration $N_a$, Equation 53 may be simplified. This simplification has been used above:

$$W_{dp} = \sqrt{ \frac{2e_s V_0}{qN_a} } \quad (55)$$

Figure 12B:
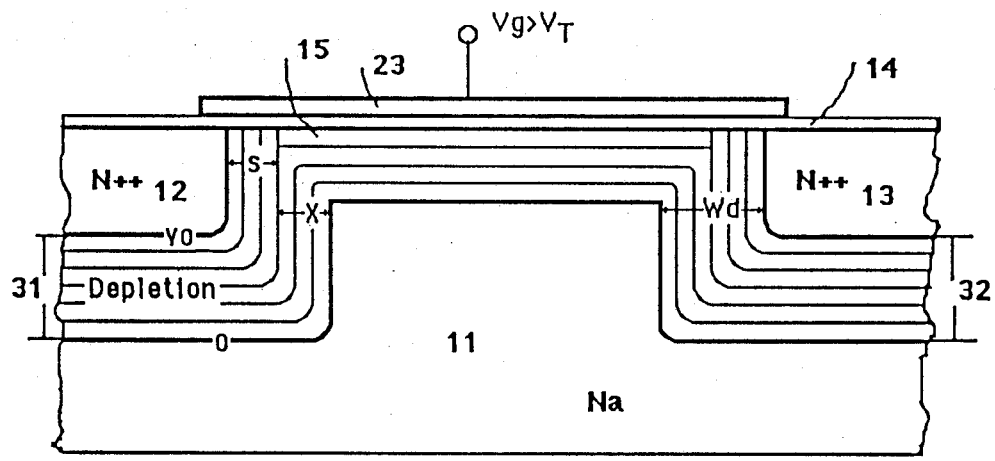

The effect of these depletion regions upon channel formation will now be described. When gate voltage is applied, a uniform equipotential situation must occur, which blends the equipotential contours below the channel, with those contours already surrounding the diffusions. The result is illustrated in FIG. 12B. In order to satisfy the equipotential criterion, the ionized P-region under the gate oxide layer, as a result of gate voltage, does not extend all the way to the diffusions. Neither does the channel 15.

Figure 13:
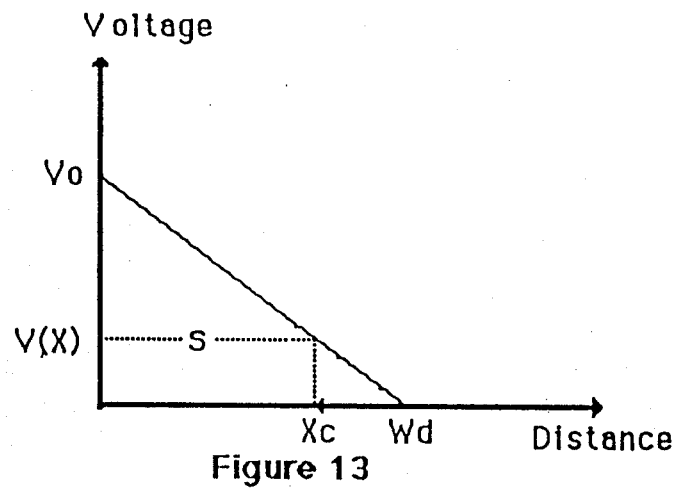
FIG. 13 graphically illustrates channel penetration into the drain depletion region according to the present invention.

The penetration distance $X_c$ of the channel and its associated depletion region into the drain and source depletion regions, may be calculated as follows: Assuming an abrupt junction, FIG. 13 illustrates the potential vs. distance from the stochastic junction of the source or drain depletion regions.

From Poisson's equation the following expression describes junction contact potential $V_o$ and potential $V(X)$ at position X measured from the end of the diffusion depletion region:

$$V_0 = \tfrac{1}{2}q \frac{N_a}{e_s} W_{do}^2 \quad \text{Junction Contact Potential, and} \tag{56}$$

$$V(X) = \tfrac{1}{2}q \frac{N_a}{e_s} X^2 \quad \text{Voltage At Postion } X_c, \tag{57}$$

where $$V_o = KT/q \, L_n(N_a N_d/N_i^2), \tag{58A}$$

$$X = W_d - S, \text{ and} \tag{58B}$$

$$S = \text{Channel to diffusion spacing.} \tag{58C}$$

Solving Equations 56 and 57 for V(X) in terms of $W_d$ and $V_o$:

$$V(X) = \left(\frac{X}{W_d}\right)^2 \tag{59}$$

Using the expression given by Equation 58B, equation 59 becomes $$V(X) = V_0\left(1 - \frac{S}{W_d}\right)^2. \tag{60}$$

The channel spacing distance S may be described in terms of depletion potential V(X) at position X as follows:

$$S = W_{do}\left(1 - \sqrt{\frac{V(X)}{V_0}}\right) \tag{61}$$

In order to establish the equipotential contours within the depletion region surrounding the drain and source diffusions, FIG. 12B, voltage V(X) must be equal to the potential $\phi_s(X)$ at the ends of the channel region. The expression for $\phi_s$ has been previously obtained and is repeated below for convenience:

$$\phi_s = \frac{q}{2e_s} N_a W_{dc}^2 \tag{62}$$

where $W_{dc}$ is the depth of the depletion region in the substrate below the oxide layer.

$$W_{dc} = \sqrt{\frac{2e_s}{qN_a} \phi_s} \tag{63}$$

Potential $\phi_s$ must be equal to diffusion potential V(X). Thus from Equations 62 and 60:

$$\phi_s = V_0\left(1 - \frac{S}{W_{do}}\right)^2 \tag{64}$$

Solving Equation 64 for $S/W_{do}$, the following expression for the ratio of spacing to depletion width is obtained:

$$\frac{S}{W_{do}} = \left(1 - \sqrt{\frac{\phi_s}{V_0}}\right) \tag{65}$$

It will be understood from Equation 65 that channel spacing disappears when $\phi_s = V_o$. This condition requires that $N_p^* = N_d$ and is a situation that never occurs. In fact, surface potential $\phi_s$ remains close to twice the Fermi potential, $2\phi_f$, for all practical values of gate voltage. Therefore Equation 65 may be conveniently approximated as:

$$S = W_{do}\left(1 - \sqrt{\frac{2\phi_f}{V_0}}\right) \tag{66}$$

Thus, at threshold, there is a channel-to-diffusion spacing at each end of the channel having the value specified by Equation 66. This channel-diffusion spacing distance S may be minimized by diminishing depletion width $W_d$ by increasing acceptor concentration $N_a$ and/or using lightly doped drain and source extension regions.

The analysis presented above assumes that no voltage is applied to the drain or source diffusions. If voltage V is applied, the width of the diffusion depletion region increases. This effect is given by Equation 66.

$$W_d = \sqrt{\frac{2e_s}{qN_a}(V_0 + V)} \tag{67}$$

The above analysis may be repeated for an applied voltage $V_o$. The result is that spacing distance, $S_d$, has the same form as Equation 66 except that depletion width $W_d > W_{do}$ due to voltage V.

$$S_d = W_d\left(1 - \sqrt{\frac{2\phi_f}{V_0}}\right) \tag{68}$$

Accordingly, the effective channel length L* may be defined as follows:

$$L^* = L - (S_d + S_s), \tag{69}$$

where $S_s$ is the channel - diffusion spacing at the source, and $S_d$ is the channel - diffusion spacing at the drain.

For long-channel devices, $S_d$ and $S_s$ remain a small fraction of length L. However, for short-channel devices, $(S_s + S_d)$ can be a significant fraction of diffusion spacing length L particularly when drain voltage is applied. The increase in voltage at the drain end of the channel, for example, resulting from drain voltage $V_d \leq V_{dsat}$, is modified by the factor $2\phi_f/V_o$. Thus:

$$V(X) = (2\phi_f/V_0)V_d \tag{70}$$

At pinch-off, the following condition applies:

$$(2\phi_f/V_0)V_d = (V_g - V_t) \tag{71}$$

Solving Equation 70 for pinch-off voltage, one obtains a value greater than that reported in the literature:

$$V_p = (V_g - V_t)\frac{V_o}{2\phi_f} \tag{72}$$

When drain voltage exceeds pinch-off voltage, the depletion region around the drain diffusion expands and the end-of-the-channel region must slip back toward the source to maintain potential equilibrium, such that $V(X)=(V_g-V_t)$. This effect is the origin of drain conductance:

$$\frac{dI_d}{dV_d} = \frac{I_{dsat}}{L^*}\left(1 - \sqrt{\frac{2\phi_f}{V_0}}\right)\frac{e_s}{qN_aW_d} \tag{73}$$

Note that if $2\phi_f=V_o$, drain conductance would be zero. If acceptor concentration $N_a$ is too high, in the vicinity of the drain diffusion adjacent the channel, impact ionization break-down will occur at relatively low drain voltage. To summarize the results of effective channel length $L^*$, it appears that in conventional FETs, the inversion channel never touches the drain or source diffusions due to the self depletion regions surrounding these diffusions in the vicinity of the intended channel region. Channel conduction requires injection at the source. It would also appear that the channel $L^*$ is shorter than L by the sum of the channel spacing factors $S_s+S_d$. Thus, the channel shrinking effect may be significant in short channel conventional FET devices if substrate doping is not increased to accommodate the effect. $L^*$ is the origin of threshold voltage variation with channel length and drain voltage. It will be understood by those having skill in the art that the Fermi-FET totally eliminates this problem. Finally, it would appear that in conventional FET designs, pinch-off voltage is greater than $(V_g-V_t)$ by the factor $V_o/2\phi_f$.

Multiple Gate Fermi-FET

Figure 14:
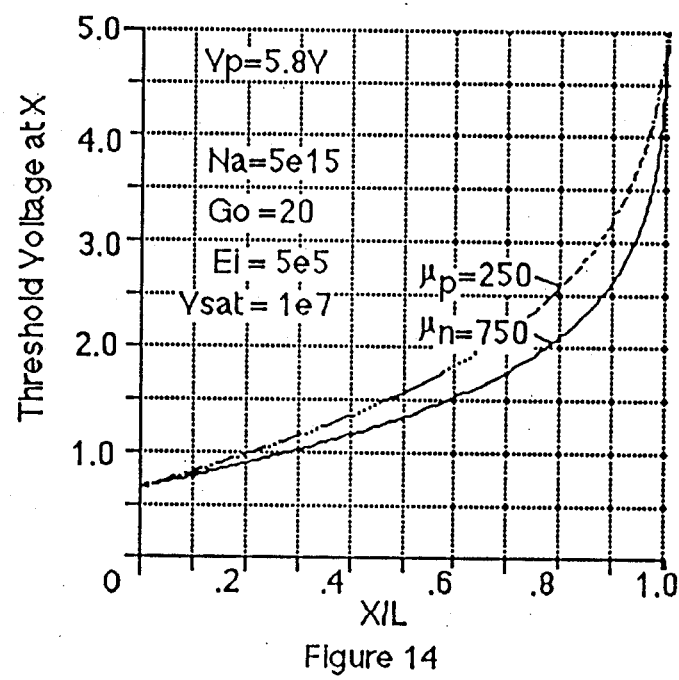
FIG. 14 graphically illustrates variation of threshold voltage with distance according to the present invention.

It will be understood by those having skill in the art that many applications of FET's require transistors to be connected in series. For example, CMOS (complementary MOS) logic technology requires connecting transistors in series to achieve the desired logic function while maintaining essentially zero idle power. For typical (non-Fermi) FET's, a series arrangement of transistors limits circuit performance in several ways. First, the threshold voltage for each of the series transistors, at best, corresponds to the threshold voltage along the gate of a single transistor whose total channel length is equal to the sum of the channel length's of all series transistors. In contrast, threshold voltage computed for the Fermi-FET is shown in FIG. 14 as a function of position along the channel, for a typical P- and N-Channel device. It is apparent that threshold voltage remains below $V_{dd}/2$ along 80% of the total channel length. Based on the above, according to the invention, a separate gate may be provided at the drain end of the channel in a Fermi-FET, the potential of which is always at the full "on" value. In particular, the potential is the power supply voltage, $V_{dd}$, for N-channel devices and is at ground for P-channel devices. This gate is called an accelerator electrode, and is illustrated in FIG. 15, at 23a. The polysilicon gate contact is illustrated at 18a.

The threshold voltage for the remaining gate or gates located along the channel of a Fermi-FET device, is reduced substantially by use of the accelerator gate technique. Turn on delay is thereby minimized. Variance in threshold voltage of series connected transistors adds delay to the response time of the circuit and depends on the rise time of each of the gate input functions of a conventional CMOS configuration. The current capability of the series transistor configuration is diminished by factor N from the current conduction capability of a single transistor. It may be shown that switching frequency depends inversely on the square of the channel length and therefore on $N^2$, where N is the number of transistors connected in series. Therefore, response time varies directly with the square of the CMOS Fan-in factor, i.e. $N^2$. Part of the voltage drop along conventional FET transistors, includes differences in the depletion potential at both ends of the channel due to diffusions contacting the substrate. The Fermi-FET device completely eliminates this source of potential drop and therefore is better suited for CMOS than conventional FET devices.

The non-inversion mechanism of filling the self depleted implant channel of the Fermi-FET with conduction carriers, permits construction of the multi-gate FET design shown in FIG. 16A. FIG. 16B illustrates the multi-gate structure operating at pinch-off.

This plural gate structure is ideal for use in logic circuits or other applications requiring transistors connected in series, such as CMOS. The multi-gate structure has diffusion rails 33a, 33b that separate one transistor channel region from another. These diffusion rails need not have contact metal as needed by individual transistors connected in series. The depth of the diffusion rails are the same as the source and drain regions and nominally have the same depth $Y_o$ as the implemented channel. The resistance of the source, drain and rail regions should be less than 200Ω per square. Alternatively, the source drain and rails may be deeper than the channel, for example, up to twice as deep. The diffusion rail design lowers diffusion capacity and eliminates one diffusion per transistor region, thus minimizing the space occupied by the circuit. The ends of each poly gate region overlap the rails of width W and length L, to ensure proper gate induced channel filling with conduction carriers. FIG. 16A does not illustrate a minimum geometry configuration. In that case, rail width W would be the same as channel length L.

Substrate Bias Voltage

According to the invention, a DC voltage may be employed to bias the substrate of the Fermi-FET and allow the critical depth $Y_o$ of the implanted channel to be increased by the factor $\sqrt{(1+V_{sub}/\phi_s)}$. This depth increase improves initial drain conductance when bias is applied, and may be used to ease the shallow implant constraint. The increase in channel depth is necessary to insure that the Fermi-FET criteria is still met, i.e. there is no vertical electric field at the substrate-thin oxide interface at threshold of a grounded source Fermi-FET when the substrate bias is applied. The expression for variation of the critical implant depth $Y_o$ in terms of the substrate voltage $V_{sub}$ is:

$$Y_0 = \sqrt{\frac{2e_s}{qN_a}(\phi_s + |V_{sub}|)\frac{1}{\alpha(\alpha+1)}} \tag{74}$$

Where $V_{sub}$ is the substrate voltage and the other parameters are as previously defined for Equation (3A).

Substrate bias voltage must have a polarity that reverse biases the diffusion-substrate junction. Accordingly for N-channel devices, substrate bias voltage is negative, while for P-channel devices, substrate bias voltage is positive. The value of substrate bias voltage must not be too high because this bias voltage linearly decreases the maximum drain voltage that initiates impact ionization at the diffusion-substrate junction. A substrate bias having absolute value of less than 2V is considered optimum.

Figure 16:
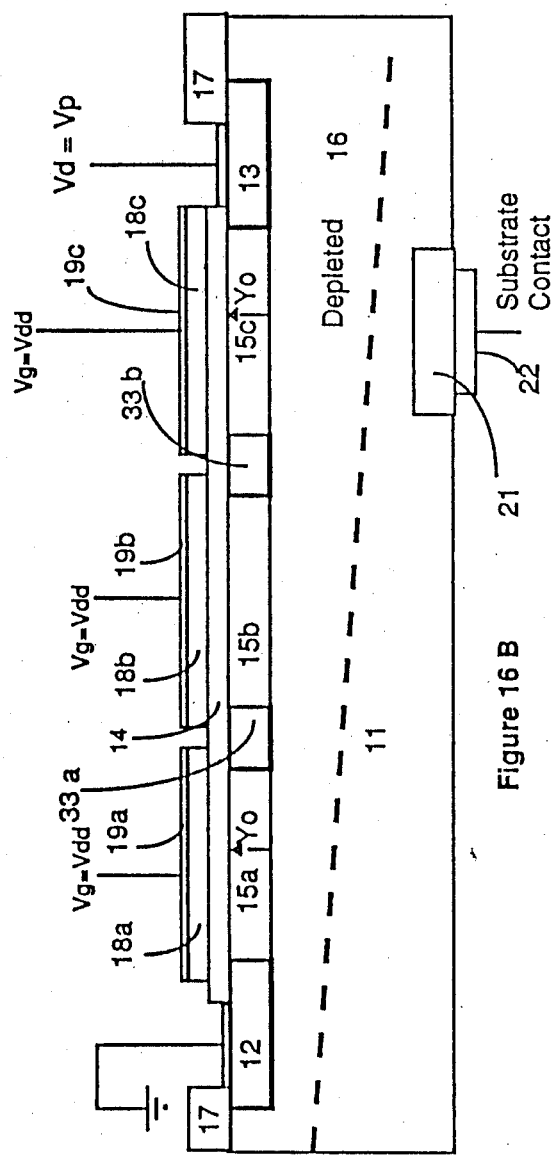
FIGS. 16A–16B illustrate cross-sectional views of multiple gate Fermi-FET's according to the present invention.

Referring to FIGS. 1, 10 and 16, the substrate bias voltage $V_{sub}$ may be applied to substrate contact 22 rather than grounding this substrate contact as shown in these Figures.

The substrate bias voltage of the present invention provides the following advantages: First, while the Fermi-FET criteria is still maintained, the Fermi-FET criteria is satisfied at a deeper channel depth when substrate bias is applied. Accordingly, ease of manufacturability is obtained. Moreover, since in the preferred embodiment the source and drain diffusions have the same depth as the channel implant, the source and drain diffusion depths are preferably increased to equal the channel depth with substrate bias. Accordingly, the resistance of the source and drain diffusions, measured in ohms per square, is reduced. Diffusion capacitance at ground potential is also reduced since the depletion depth is increased by the substrate bias voltage. Substrate bias also eliminates the possibility of ground plane noise causing the substrate-diffusion junction to be randomly forward biased. Gate capacitance is also reduced because capacitance is inversely proportional to the channel depth.

The disadvantage of substrate bias is that the transconductance of the device decreases with increasing substrate bias. However, the toggle rate of the Fermi-FET device with substrate bias is essentially the same as a Fermi-FET without substrate bias because the diminished capacitive loading offsets the decrease in transconductance.

Continuous Depletion Boundary to Reduce Punch Through

It has previously been described that substrate dopant level and the subdiffusion-drain implant dopant factor $K_d$ may be employed to simultaneously control both punch-through and avalanche breakdown of the Fermi-FET device. According to the invention punch-through of an FET device may be further reduced by insuring that the depth of the depletion region in the substrate at threshold is the same under the source and drain diffusions as it is under the implanted channel. In addition to controlling punch-through, this depletion depth equality insures that the depletion charge demanded by drain voltage does not conflict with the equilibrium space charge below the depleted channel. This interference would result if the source and drain diffusion regions had a depth which is greater than the depth of the channel.

It will be understood by those having skill in the art that in conventional MOSFET devices, the depth of the induced channel at strong inversion is in the order of 100 Å. A practical minimum depth for diffusions to guarantee good metal contact is about 1000 Å. Consequently, channel-diffusion depth equality to control punch-through in conventional MOSFET devices is not possible.

Punch-through in the Fermi-FET may occur when the depletion boundary surrounding the drain diffusion reaches across under the channel and touches a specific portion of the depletion boundary surrounding a grounded source. When this touching occurs, the source diffusion starts to inject minority carriers, and punch-through begins. Punch-through only occurs when the depth of the depletion regions below the source diffusion exceeds the depth of the depletion region developed in the substrate below the source end of the channel. This situation always occurs in MOS devices because of the shallow inversion layer.

Figure 17B:
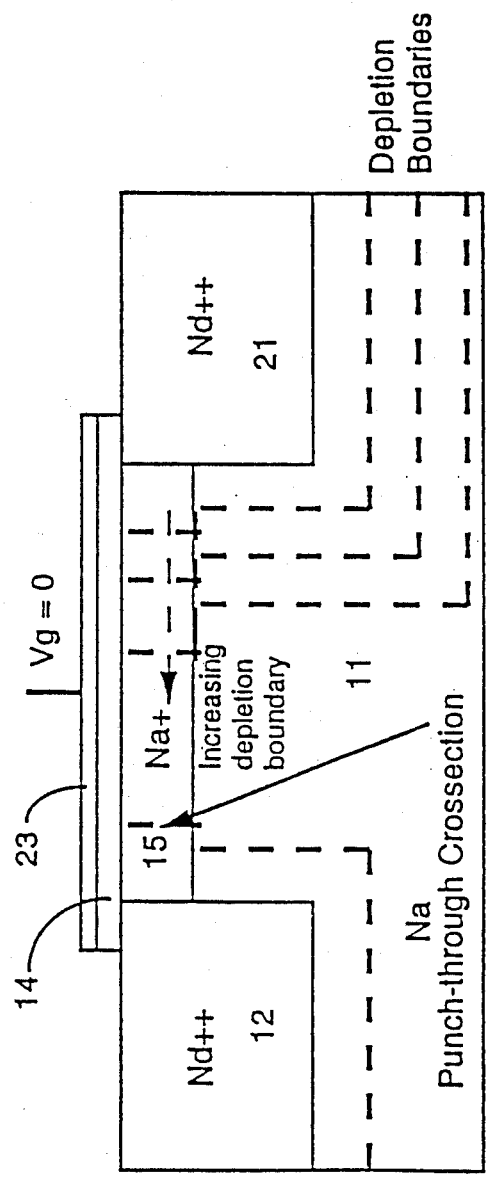

FIGS. 17A and 17B illustrate the punch-through mechanism for conventional MOS devices where the channel region is lightly doped compared to the substrate (FIG. 17B), or more heavily doped than the substrate (FIG. 17A). For a lightly doped channel region, punch-through occurs in the channel region when gate voltage is below threshold. This effect leads to high leakage current overriding the sub-threshold current. For the heavily doped channel region, punch-through first occurs below the channel region. The punch-through cross section is identified in FIG. 17 and is the area of the source depletion boundary facing the drain diffusion where tangential depletion boundary interference may occur.

Figure 18:
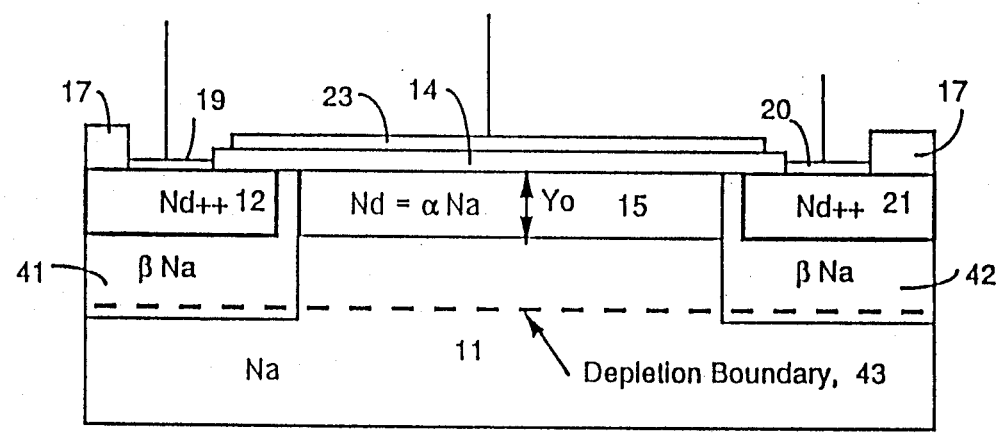
FIG. 18 illustrates a Fermi-FET having a continuous depletion boundary according to the present invention.

The Fermi-FET design allows the depth of the depletion region to have continuity at the source and the channel. FIG. 18 illustrates a cross sectional view of a Fermi-FET. The depletion boundary 43 is illustrated between diffusions and below the channel implanted at the Fermi-FET depth $Y_o$ with zero drain and source voltage.

As shown in FIG. 18, the diffusion depths of the source and drain 12 and 21 respectively are the same as the depth $Y_o$ of channel 15. The continuous depletion boundary 43 eliminates punch-through cross section and is accomplished by use of substrate enhancement pocket regions 41 and 42 into which the source and drain diffusion regions 12 and 21 respectively, are implanted. The substrate pocket regions 41 and 42 have the same conductivity type as the substrate and have a doping factor $\beta$ greater than the substrate. The depth of the depletion region below the source diffusion is given by:

$$W_{ds} = \sqrt{\frac{2e_s}{qN_s\beta} V_0} \tag{75}$$

where $$V_0 = \frac{KT}{q} \ln\left(\frac{N_d + \beta N_s}{N_i^2}\right) \quad \begin{array}{l}\text{If depletion depth} \\ \text{is confined to the} \\ \text{pocket region;}\end{array}$$

$N_s$ = Substrate impurity concentration;
$N_d+$ = Diffusion impurity concentration of opposite conductivity;
$N_i$ = Intrinsic carrier concentration; and
$\beta$ = Pocket implant factor.

The depth of the depletion region below the Fermi channel is given by:

$$W_{dc} = \sqrt{\frac{2e_s}{qN_s} \phi_s \left(\frac{\alpha}{\alpha + 1}\right)} \tag{76}$$

where

-continued $$\phi_s = 2\phi_f + \frac{KT}{q} \ln(\alpha);$$

$$\phi_f = \frac{KT}{q} \ln\left(\frac{N_s}{N_i}\right);$$

$\alpha$ = Channel implant factor; and
$e_s$ = dielectric constant of the substrate.

Punch-through is prevented when $W_{ds} = W_{dc}$. This condition is true when $$\beta = \frac{V_0}{\phi_s}\left(\frac{\alpha+1}{\alpha}\right) \quad (77)$$

In view of the definitions for $V_o$ and $\phi_s$, the solution to Equation (77) is a transcendental equation:

$$\beta = \frac{N_i^2}{N_s N_d^+}\left(\frac{\alpha N_s^2}{N_i^2}\right)^{\beta(\frac{\alpha}{\alpha+1})} \quad (78)$$

Figure 19:
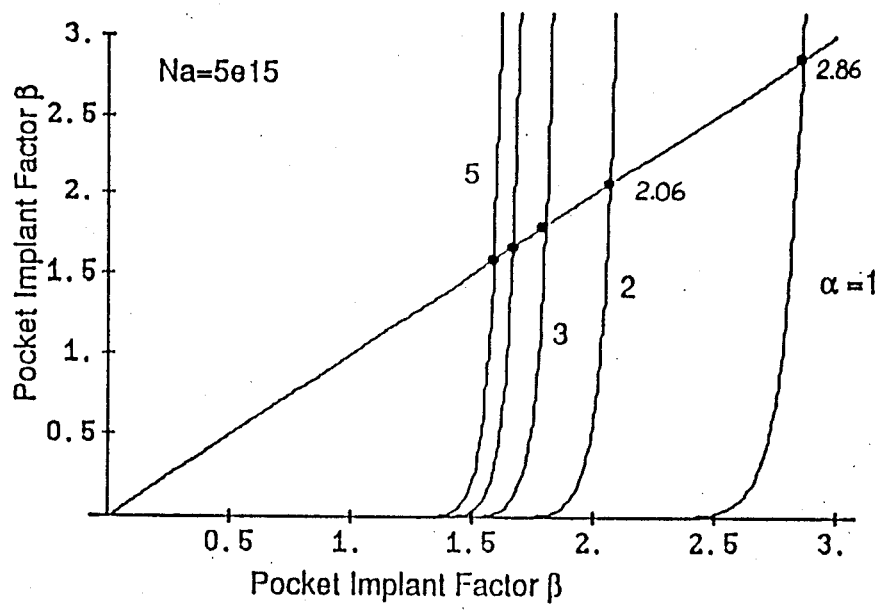
FIG. 19 graphically illustrates the solution of a transcendental equation to obtain the pocket implant factor according to the present invention.

The solution points for pocket implant factor $\beta$ are illustrated in FIG. 19 at the intersection points of the two functions plotted. The plot assumes $N_d^+ = 1e20$, $N_s = 5e15$, $N_i = 1.5e10$ and has the range $\alpha = 1-5$.

Figure 20:
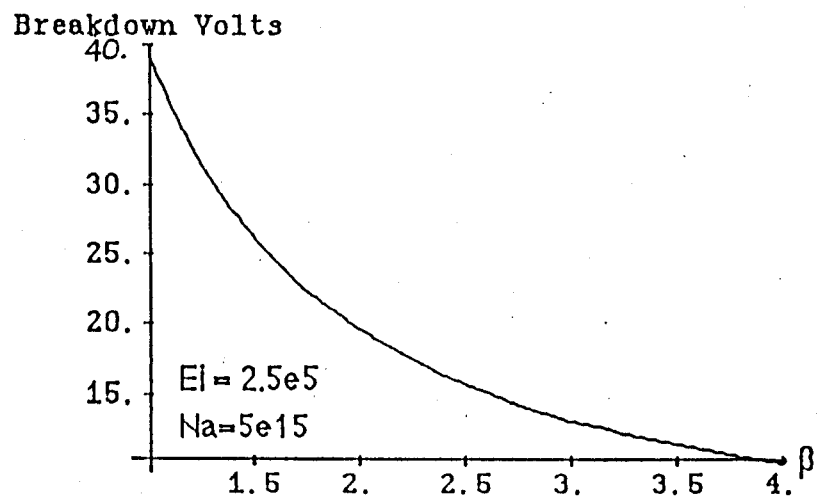
FIG. 20 graphically illustrates avalanche breakdown voltage as a function of the pocket implant factor according to the present invention.

From FIG. 19 it may be seen that the pocket implant factor $\beta$ is not very great. For example, for $\alpha = 1$, $\beta = 2.86$; for $\alpha = 2$, $\beta = 2.06$. This low value is desired since the only voltage breakdown mechanism left is avalanche breakdown that can occur at the diffusion-pocket junction below the drain diffusion. FIG. 20 illustrates avalanche breakdown voltage plotted as a function of the pocket impurity concentration factor $\beta$ assuming the ionization field is 2.5e5 V/cm.

$$V_a = \frac{E_i^2 e_s}{2q\beta N_s} \quad (79)$$

For example, if substrate doping is 5e15 and $\beta = 2.86$ then the pocket doping is 1.43e16. According to FIG. 20, avalanche breakdown occurs at 14 volts when channel implant factor $\alpha = 1.0$, $\beta = 2.86$ and substrate doping is 5e15. Breakdown increases as $\alpha$ is increased and decreases with increasing substrate impurity. The nominal substrate impurity concentration $N_s$ is about 5e15 per cm$^3$. This value may be increased to 8e15 for channel lengths below 0.5 $\mu$m. This range of substrate doping allows the depth $Y_o$ of the Fermi channel to be about 2000 Å. Substrate bias and channel depth compensation for the bias voltage may be used to further increase this depth.

Figure 21A:
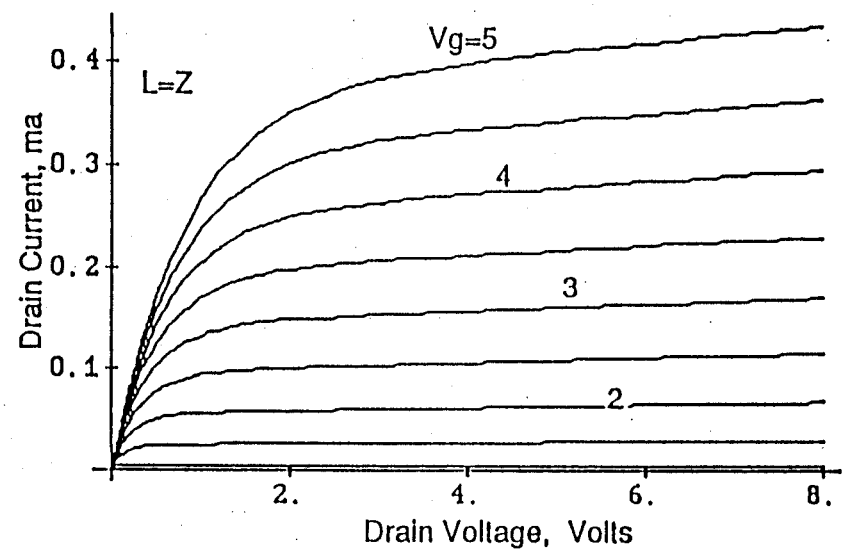
FIG. 21A–21B graphically illustrate voltage/current characteristics of Fermi-FETs according to the present invention.
Figure 21B:
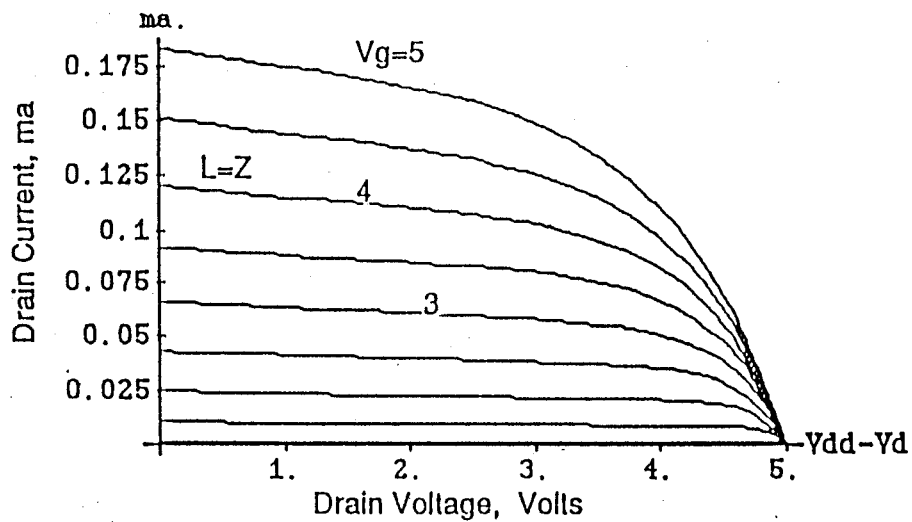
Figure 22A:
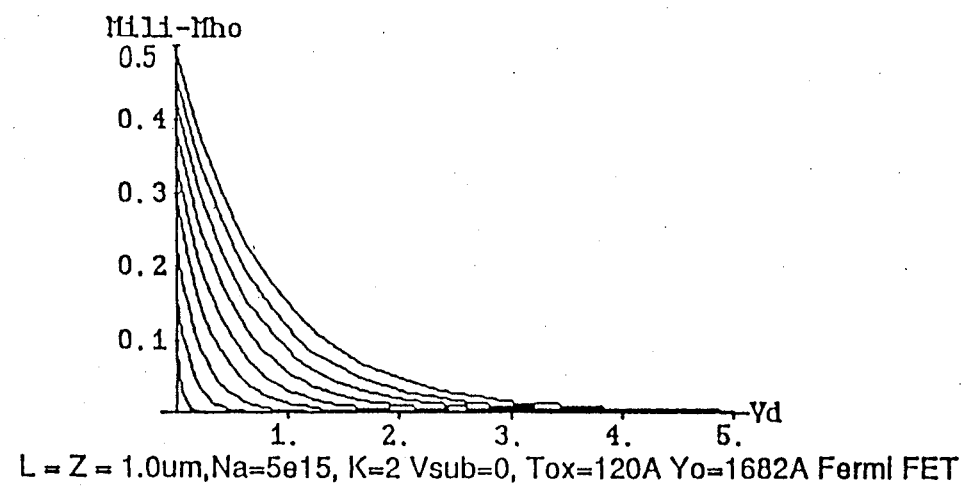
FIGS. 22A–22F graphically illustrate drain conductance as a function of drain and gate voltage according to the present invention.
Figure 22B:
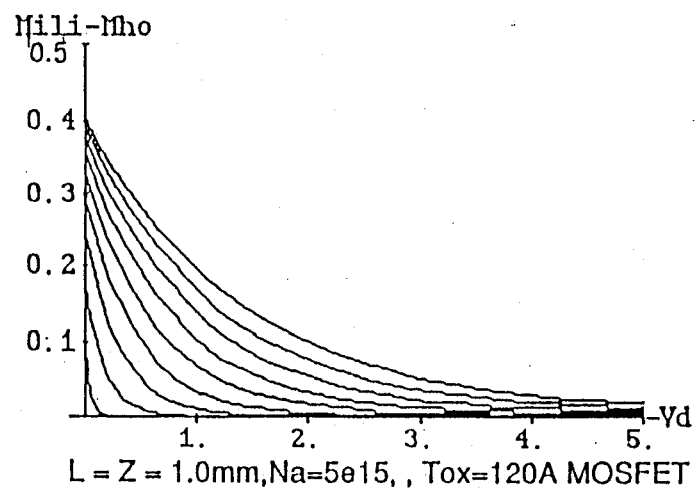
Figure 22C:
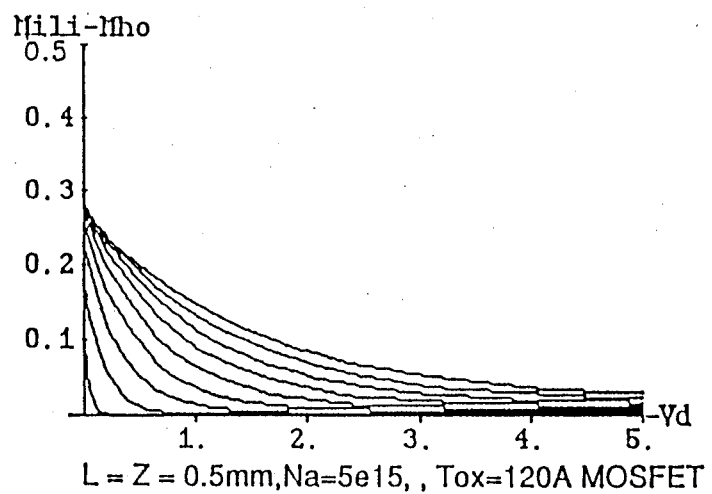
Figure 22D:
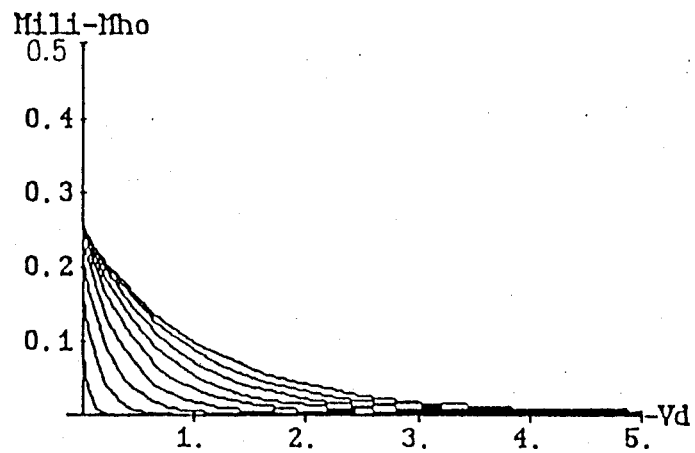
Figure 22E:
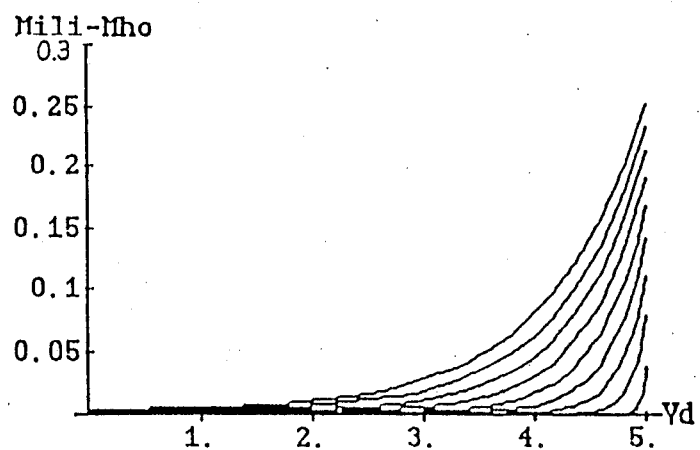
Figure 22F:
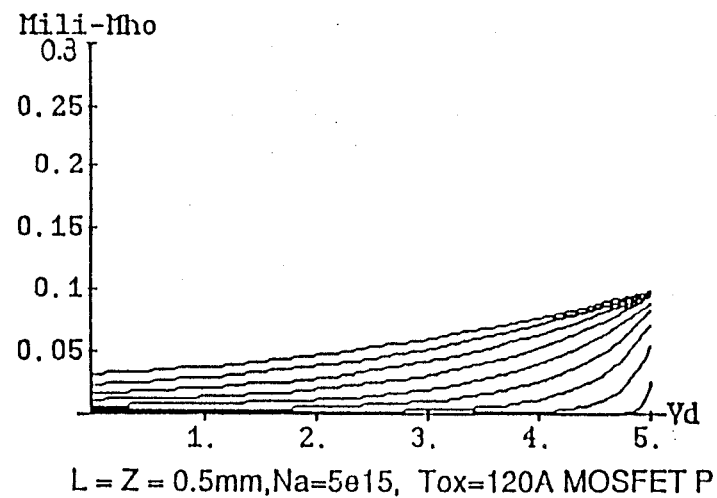

FIG. 21A is a computer generated plot of an N-channel Fermi-FET with a channel length and width of 0.5 $\mu$m, a channel implant factor of 2, a substrate dopant concentration of 5e15 acceptors per cm$^3$, a 120 Å thin oxide layer, and a diffusion pocket doped at 1e16 acceptors per cm$^3$ and a channel depth of 1682 Å. FIG. 21B is a plot of a P-channel Fermi-FET with a 0.5 $\mu$m channel length and width. The same parameters were used except for opposite conductivity material.

The calculation of channel leakage current in the Fermi-FET will now be described. The principal leakage current flows between the source and drain when gate voltage is below threshold. This leakage current flows in the channel space charge region. The generation current density is essentially the intrinsic value $N_i$. For silicon, $N_i = 1.5e10$ per cm$^3$. The space charge region below the channel is adjusted to terminate diffusion of carriers across the drain or source diffusions contacting the substrate region. Diffusion velocity in this region is limited by carrier lifetime. Leakage current in this region is several orders of magnitude below channel leakage current and therefore will be ignored.

Channel leakage current when drain voltage is applied may be calculated as follows: In this analysis, the source is assumed to be at ground potential. Channel leakage current is defined as $I_L$.

$$I_L = A\left[qN_i V + qD_n\frac{dN}{dx}\right] \quad (80)$$

Where area A is the product of the channel depth $Y_o$ and channel width Z. For purposes of this analysis it will be assumed that the drift and diffusion terms are equal. Therefore:

$$qN_i V = qD_n\frac{dN}{dx} \quad (81)$$

Solving for $dN/dx$ $$\frac{dN}{dx} = \frac{N_i V}{D_n} \quad (82)$$

But since;

$$D_n = \frac{KT}{q}\mu \text{ and} \quad (83)$$

$$V = \mu E_1 \quad (84)$$

Therefore $$\frac{dN}{dx} = \frac{N_i E_1}{\frac{KT}{q}} \quad (85)$$

Below threshold, the lateral field in the channel is $V_d/L$ where $V_d$ is drain voltage and L is channel length. Therefore;

$$\frac{dN}{dx} = \frac{N_i V_d}{L\frac{KT}{q}} \quad (86)$$

Calculating the diffusion current from equation (80):

$$\frac{I_L}{2} = Y_0 Z_q \mu N_i \frac{V_d}{L} \quad (87)$$

Care must be exercised when evaluating Equation (87). For a given drain voltage $V_d$, mobility $\mu$ is not arbitrary. In fact, when drain voltage is above a critical value, carriers in the depleted channel reach thermal saturation velocity $V_{sat} = 1e7$ cm/sec. Thus it is more appropriate to express leakage current as a maximum in terms of saturation velocity, as follows:

$$I_L = 2Y_o Z_q V_{sat} N_i \quad (88)$$

The expression for channel depth $Y_o$ is;

$$Y_0 = \sqrt{\frac{2\varepsilon_s \phi_s}{qN_a \alpha(\alpha + 1)}} \quad (89)$$

Evaluating Equation (88) for a channel width of 1e-4 cm, $N_a=5e15$, $N_i=1.5e10$, $\alpha=1$, $Y_o=2.9e$-5cm, the leakage current is 1.5e-10 amps.

Unlike MOSFET devices, this leakage current is essentially independent of gate voltage below threshold voltage. Threshold is defined for the Fermi-FET as the value of gate voltage that is equal to surface potential $\phi_s$. The measured leakage current may be higher than that predicted. The primary reason is that after implantation of the channel, some lattice damage occurs which may increase the effective intrinsic carrier concentration.

FIGS. 22A-22F illustrate drain conductance as a function of drain and gate voltage for both the MOSFET and the Fermi-FET. A measure of quality is the ratio of initial drain conductance to drain conductance at a drain voltage of 2V. The Fermi-FET ratio is typically greater than 3 times the MOSFET ratio.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A field effect transistor comprising:
a semiconductor substrate having a first surface, and being doped at a first dopant density;
a substrate contact for electrically contacting said substrate;
means for applying a substrate bias voltage to said substrate contact;
source and drain regions in said substrate at said first surface;
a channel in said substrate at said first surface, between said source and drain regions, said channel being doped at a second dopant density and having a predetermined depth from said first surface;
a gate insulating layer on said substrate at said first surface adjacent said channel, at least said first and second dopant densities, said substrate bias voltage and said predetermined depth being selected to produce zero electric field at said first surface between said channel and said gate insulating layer; and
source, drain and gate contacts for electrically contacting said source and drain regions and said gate insulating layer, respectively.

2. The field effect transistor of claim 1 further comprising first and second substrate enhancement pocket regions in said semiconductor substrate, adjacent said source and drain regions respectively, said substrate enhancement pocket regions being of same conductivity type as said substrate and having a dopant density which is a factor times said first dopant density, said factor being selected to produce a continuous depletion region under said source, drain and channel regions at a second predetermined depth from said first surface.

3. The field effect transistor of claim 1 wherein said channel is N-type and wherein said substrate bias voltage is negative.

4. The field effect transistor of claim 1 wherein said channel is P-type and wherein said substrate bias voltage is positive.

5. The field effect transistor of claim 1 wherein the absolute value of said substrate voltage is less than 2 volts.

6. A field effect transistor comprising:
a semiconductor substrate having a first surface, and being doped at a first dopant density;
a substrate contact for electrically contacting said substrate;
means for applying a substrate bias voltage to said substrate contact;
source and drain regions in said substrate at said first surface;
a channel in said substrate at said first surface, between said source and drain regions, said channel being doped at a second dopant density and having a predetermined depth from said first surface, at least said first and second dopant densities, said substrate bias voltage and said predetermined depth being selected to produce a threshold voltage for said field effect transistor which is twice the Fermi potential of said semiconductor substrate;
a gate insulating layer on said substrate at said first surface adjacent said channel; and
source, drain and gate contacts for electrically contacting said source and drain regions and said gate insulating layer, respectively.

7. The field effect transistor of claim 6 further comprising first and second substrate enhancement pocket regions in said semiconductor substrate, adjacent said source and drain regions respectively, said substrate enhancement pocket regions being of same conductivity type as said substrate and having a dopant density which is a factor times said first dopant density, said factor being selected to produce a continuous depletion region under said source, drain and channel regions at a second predetermined depth from said first surface.

8. The field effect transistor of claim 6 wherein said channel is N-type and wherein said substrate bias voltage is negative.

9. The field effect transistor of claim 6 wherein said channel is P-type and wherein said substrate bias voltage is positive.

10. The field effect transistor of claim 6 wherein the absolute value of said substrate voltage is less than 2 volts.

11. A field effect transistor comprising:
a semiconductor substrate having a first surface, and being doped at a first dopant density;
a substrate contact for electrically contacting said substrate;
means for applying a substrate bias voltage to said substrate contact;
source and drain regions in said substrate at said first surface;
a channel in said substrate at said first surface, between said source and drain regions, said channel being doped at a second dopant density and having a predetermined depth from said first surface and a predetermined length from said source to said drain;
a gate insulating layer on said first surface adjacent said channel, said gate insulating layer having a predetermined thickness, at least said first and second dopant densities, said substrate bias voltage and said predetermined depth being selected to produce a threshold voltage for said field effect transistor which is independent of said predetermined length and said predetermined thickness; and source, drain and gate contacts for electrically contacting said source and drain regions and said gate insulating layer, respectively.

12. The field effect transistor of claim 11 further comprising first and second substrate enhancement pocket regions in said semiconductor substrate, adjacent said source and drain regions respectively, said substrate enhancement pocket regions being of same conductivity type as said substrate and having a dopant density which is a factor times said first dopant density, said factor being selected to produce a continuous depletion region under said source, drain and channel regions at a second predetermined depth from said first surface.

13. The field effect transistor of claim 11 wherein said channel is N-type and wherein said substrate bias voltage is negative.

14. The field effect transistor of claim 11 wherein said channel is P-type and wherein said substrate bias voltage is positive.

15. The field effect transistor of claim 11 wherein the absolute value of said substrate voltage is less than 2 volts.

16. A field effect transistor comprising:
a semiconductor substrate of first conductivity type, having a first surface, and being doped at a first dopant density $N_s$, said semiconductor substrate having an intrinsic carrier concentration $N_i$ at temperature T degrees Kelvin, and a dielectric constant $e_s$;
a substrate contact for electrically contacting said substrate;
means for applying a substrate bias voltage $V_{sub}$ to said substrate contact;
source and drain regions of second conductivity type in said substrate at said first surface;
a channel of said second conductivity type in said substrate at said first surface between said source and drain regions, said channel being doped at a second dopant density which is a factor $\alpha$ times said first dopant density $N_s$, said channel having a predetermined depth $Y_o$ from said first surface, with $Y_o$ being equal to $\sqrt{(2e_s(\phi_s+|V_{sub}|))/(q-N_s\alpha(\alpha+1))}$, where $\phi_s$, is equal to $(KT/q)\ln(N_s/N_i)^2+(KT/q)\ln\alpha$, q is equal to $1.6\times10^{-19}$ coulombs, and K is equal to $1.38\times10^{-23}$ Joules/°Kelvin;
a gate insulating layer on said substrate at said first surface adjacent said channel; and
source, drain and gate contacts for electrically contacting said source and drain regions and said gate insulating layer, respectively.

17. The field effect transistor of claim 16 further comprising first and second substrate enhancement pocket regions in said semiconductor substrate, adjacent said source and drain regions respectively, said substrate enhancement pocket regions being of same conductivity type as said substrate and having a dopant density which is a factor times said first dopant density, said factor being selected to produce a continuous depletion region under said source, drain and channel regions at a second predetermined depth from said first surface.

18. The field effect transistor of claim 16 wherein said channel is N-type and wherein said substrate bias voltage is negative.

19. The field effect transistor of claim 16 wherein said channel is P-type and wherein said substrate bias voltage is positive.

20. The field effect transistor of claim 16 wherein the absolute value of said substrate voltage is less than 2 volts.

21. The field effect transistor of claim 16 wherein said source and drain regions have a predetermined depth from said first surface which is less than twice $Y_o$.

22. The field effect transistor of claim 16 wherein said source and drain regions have a predetermined depth from said first surface which is equal to $Y_o$.

23. A field effect transistor comprising:
a semiconductor substrate of first conductivity type, having a first surface and being doped at a first dopant density $N_a$;
source and drain regions of second conductivity type in said substrate at said first surface;
a channel of said second conductivity type in said substrate at said first surface, between said source and drain regions;
a gate insulating layer on said substrate at said first surface adjacent said channel;
source and drain contacts for electrically contacting said source and drain, respectively;
a gate contact for electrically contacting said gate insulating layer; and
first and second substrate enhancement pocket regions in said semiconductor substrate, adjacent said source and drain regions respectively, said substrate enhancement pocket regions being of said first conductivity type and having a dopant density which is a factor times said first dopant density, said factor being selected to produce a continuous depletion region under said source, drain and channel regions at a second predetermined depth from said first surface.

24. The field effect transistor of claim 23 wherein said field effect transistor is a Fermi-threshold field effect transistor.

* * * * *

UNITED STATES PATENT AND TRADEMARK OFFICE
CERTIFICATE OF CORRECTION

PATENT NO. : 4,984,043  
DATED : January 8, 1991  
INVENTOR(S) : Vinal

Page 1 of 3

It is certified that error appears in the above-identified patent and that said Letters Patent is hereby corrected as shown below:

Column 2, line 51, after the word "entitled", please insert "A".

Column 8, line 43, after the word "substrate", please insert --11--.

Column 9, line 35, please delete "315" and substitute --15-- therefor.

Column 13, line 47, please delete "N*=$N_a$" and substitute --$N_d$*=$N_a$-- therefor.

Column 18, line 1, before the word "may" please insert --$\phi_0$--.

Column 18, line 45, please delete entire line and substitute therefor:

$$\phi_o = \frac{q}{e_s} \int_o^{Y_n} Y_n dy \frac{1}{Y_n} \int_o^{Y_n} N(y) \, dy$$

Column 21, line 58, please delete "$E_1 2.5 \times 10^5$V/cm" and substitute --$E_i = 2.5 \times 10^5$V/cm-- therefor.

Column 21, line 63, please delete "$N_3$" and substitute --$N_s$-- therefor.

Column 22, line 10, after "factor" please delete "c" and substitute --a-- therefor.

UNITED STATES PATENT AND TRADEMARK OFFICE
CERTIFICATE OF CORRECTION

PATENT NO. : 4,984,043
DATED : January 8, 1991
INVENTOR(S) : Vinal

It is certified that error appears in the above-identified patent and that said Letters Patent is hereby corrected as shown below:

Column 22, line 66, please delete "$1.5 \times 10^{-5}$" and substitute --$1.5 \times 10^{-6}$-- therefor.

Column 23, line 1, please delete "$qN_aX_d/e_5=1.87 \times 10^6 V/cm$" and substitute --$qN_aX_d/e_s=1.87 \times 10^6 V/cm$-- therefor.

Column 23, line 62, after the word "device" please insert --.--.

Column 23, line 67, please delete "gate-to substrate-potential" and substitute --gate-to-substrate potential-- therefor.

Column 25, line 3, after "However" please insert --,--.

Column 27, line 29, please delete "G" and substitute --$G_i$-- therefor.

Column 27, line 40, please delete entire line and substitute therefor:

$$V_{td} = \phi_s \left[ 1 - \frac{G_i}{\alpha+1} \right] - \frac{G_i}{C_i} \sqrt{2qNae_s \left( \frac{\alpha}{\alpha+1} \right) \phi_s}$$

Column 27, line 54, after "an" please insert --oxide--.

UNITED STATES PATENT AND TRADEMARK OFFICE
CERTIFICATE OF CORRECTION

PATENT NO. : 4,984,043

DATED : January 2, 1990

INVENTOR(S) : Reisman et al.

It is certified that error appears in the above-identified patent and that said Letters Patent is hereby corrected as shown below:

Column 34, line 37, please delete "Which" and substitute --which-- therefor.

Signed and Sealed this

Eighteenth Day of August, 1992

Attest:

DOUGLAS B. COMER

Attesting Officer

Acting Commissioner of Patents and Trademarks